(12) United States Patent
Nishiyama et al.

(10) Patent No.: US 9,349,931 B2
(45) Date of Patent: May 24, 2016

(54) RESIN COMPOSITION, RESIN SHEET, CURED RESIN SHEET, RESIN SHEET LAMINATE, CURED RESIN SHEET LAMINATE AND METHOD FOR PRODUCING SAME, SEMICONDUCTOR DEVICE AND LED DEVICE

(75) Inventors: Tomoo Nishiyama, Tsukuba (JP); Atsushi Kuwano, Chikusei (JP); Toshiaki Shirasaka, Chikusei (JP); Naoki Hara, Chikusei (JP); Kensuke Yoshihara, Chikusei (JP); Hideyuki Katagi, Chikusei (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 39 days.

(21) Appl. No.: 14/008,486

(22) PCT Filed: Mar. 28, 2012

(86) PCT No.: PCT/JP2012/058247
§ 371 (c)(1),
(2), (4) Date: Sep. 27, 2013

(87) PCT Pub. No.: WO2012/133587
PCT Pub. Date: Oct. 4, 2012

(65) Prior Publication Data
US 2014/0015000 A1 Jan. 16, 2014

(30) Foreign Application Priority Data

Mar. 28, 2011 (JP) .................................. 2011-071251

(51) Int. Cl.
*H01L 33/64* (2010.01)
*C08J 5/18* (2006.01)
(Continued)

(52) U.S. Cl.
CPC ............ *H01L 33/641* (2013.01); *B32B 15/092* (2013.01); *B32B 27/20* (2013.01);
(Continued)

(58) Field of Classification Search
CPC ......... H01L 23/31; H01L 23/14; H01L 23/29; H01L 33/64; H01L 33/641; C08G 59/00; C08J 5/24; C08K 3/00; C08L 63/00

USPC ................................ 257/100, 793; 156/307.7
See application file for complete search history.

(56) References Cited

U.S. PATENT DOCUMENTS

2002/0050585 A1* 5/2002 Masayuki et al. ............ 252/500
2006/0022356 A1* 2/2006 Uwada et al. ................. 257/787
(Continued)

FOREIGN PATENT DOCUMENTS

| JP | 2001-055425 A | 2/2001 |
|----|---------------|--------|
| JP | 2008-013759 A | 1/2008 |

(Continued)

OTHER PUBLICATIONS

Office Action issued Apr. 11, 2014, in Taiwanese Patent Application No. 101111250.

*Primary Examiner* — Selim Ahmed
(74) *Attorney, Agent, or Firm* — Fanelli Haag PLLC

(57) ABSTRACT

The present invention provides a resin composition including an epoxy resin monomer, a novolac resin containing a compound having a structural unit represented by the following general Formula (I), and a filler, in which a particle size distribution of the filler, measured using laser diffractometry, has peaks in the respective ranges of from 0.01 μm to less than 1 μm, from 1 μm to less than 10 μm, and from 10 μm to 100 μm, and the filler contains boron nitride particles having particle sizes of from 10 μm to 100 μm. In the general Formula (I), $R^1$ represents an alkyl group, an aryl group, or an aralkyl group. Each of $R^2$ and $R^3$ independently represents a hydrogen atom, an alkyl group, aryl group, or an aralkyl group. m represents a number from 0 to 2; and n represents a number from 1 to 7.

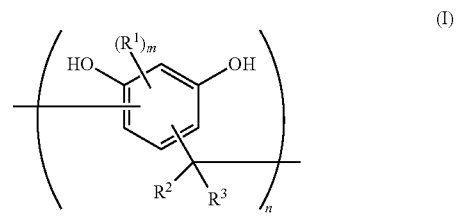

(I)

24 Claims, 6 Drawing Sheets

(51) Int. Cl.
    *H01L 23/373*     (2006.01)
    *B32B 15/092*     (2006.01)
    *B32B 27/20*     (2006.01)
    *B32B 27/38*     (2006.01)
    *B32B 27/42*     (2006.01)
    *C08L 63/00*     (2006.01)
    *H01L 23/433*     (2006.01)
    *H01L 23/473*     (2006.01)
    *H01L 23/00*     (2006.01)
    *C08K 3/38*     (2006.01)

(52) U.S. Cl.
    CPC ................ *B32B 27/38* (2013.01); *B32B 27/42* (2013.01); *C08J 5/18* (2013.01); *C08L 63/00* (2013.01); *H01L 23/3737* (2013.01); *H01L 23/4334* (2013.01); *H01L 23/473* (2013.01); *H01L 24/29* (2013.01); *H01L 24/33* (2013.01); *B32B 2457/14* (2013.01); *B32B 2457/20* (2013.01); *C08J 2363/00* (2013.01); *C08K 2003/385* (2013.01); *C08K 2201/005* (2013.01); *H01L 2224/2929* (2013.01); *H01L 2224/29386* (2013.01); *H01L 2224/29499* (2013.01); *H01L 2224/32245* (2013.01); *H01L 2224/48091* (2013.01); *H01L 2224/73265* (2013.01); *H01L 2924/12041* (2013.01); *H01L 2924/12042* (2013.01); *H01L 2924/1301* (2013.01); *H01L 2924/13055* (2013.01); *H01L 2924/181* (2013.01)

(56) References Cited

U.S. PATENT DOCUMENTS

2011/0205721 A1\*   8/2011   Endo ............................ 361/783
2012/0189818 A1\*   7/2012   Hayashi ....................... 428/161

FOREIGN PATENT DOCUMENTS

| JP | 2008-189818 A | 8/2008 |
|----|---------------|--------|
| TW | 201105699 A | 2/2011 |
| WO | WO 2010/140674 A1 | 12/2010 |

\* cited by examiner

RESIN COMPOSITION, RESIN SHEET, CURED RESIN SHEET, RESIN SHEET LAMINATE, CURED RESIN SHEET LAMINATE AND METHOD FOR PRODUCING SAME, SEMICONDUCTOR DEVICE AND LED DEVICE

TECHNICAL FIELD

The present invention relates to a resin composition, a resin sheet, a cured resin sheet, a resin sheet laminate, a cured resin sheet laminate and a method of producing the same, a semiconductor device and an LED device.

BACKGROUND ART

With the progress in the miniaturization, larger capacity, high performance of electric devices using semiconductors, the amount of heat generation from the semiconductors mounted therein with a high density is ever-increasing. For example, in order for a central processing unit of a personal computer or a semiconductor device used for controlling a motor of an electric vehicle to be operated stably, a heat sink or a radiator fin for heat dissipation is indispensable, and therefore, as a member which connects the semiconductor device with a heat sink or the like, a material which can have insulation properties and thermal conductivity in combination is demanded.

In general, for an insulating material such as a printed board which contains a semiconductor device or the like, an organic material is widely used. Although such an organic material has high insulation properties, it has a low thermal conductivity, and therefore does not have large contribution to heat dissipation of a semiconductor device or the like. On the other hand, an inorganic material such as an inorganic ceramics may be used for heat dissipation of a semiconductor device or the like. Although such an inorganic material has a high thermal conductivity, its insulation properties are far from satisfactory compared with those of an organic material. A material having high insulation properties and a thermal conductivity is thus demanded.

In connection with the above description, many studies are under way about a composite material of a resin and an inorganic filling agent having a high thermal conductivity which is referred to as "filler". For example, an epoxy resin composition which has a low melt viscosity and is capable of attaining a high filling rate of a filler is known (for example, see Japanese Patent Application Laid-Open (JP-A) No. 2001-055425). It is reported that a cured material having a complex system of a common bisphenol A epoxy resin and an alumina filler is known, which can attain the thermal conductivity of 3.8 W/mK in xenon flash method, and the thermal conductivity of 4.5 W/mK in thermal wave analysis (for example, see JP-A-2008-13759). Similarly, it is reported that a cured material having a complex system of a special epoxy resin and an amine curing agent and an alumina filler is known, which can attain the thermal conductivity of 9.4 W/mK in xenon flash method, and the thermal conductivity of 10.4 W/mK in thermal wave analysis (for example, see JP-A-2008-13759).

It is reported that, as a cured thermosetting resin having a further excellent thermal conductivity, a thermally conductive resin composition containing boron nitride, and polymer components such as an epoxy resin, an amine curing agent, and a curing catalyst can attain the thermal conductivity of 6 W/mK to 11 W/mK in thermal wave analysis (for example, see JP-A-2008-189818).

SUMMARY OF INVENTION

Technical Problem

However, there have been some cases where it is difficult for cured thermally conductive resins described in JP-A-2001-055425, JP-A-2008-13759 and JP-A-2008-189818 to satisfy all of the thermal conductivity, the adhesive strength and the insulation properties thereof at high level. Particularly, it is very difficult for a resin sheet whose insulation properties are to be secured with the resin thickness of several tens μm to secure a long-term reliability for the insulation thereof in consideration of exposure to a high temperature near the tip, or change in the temperature or humidity of the outer environment since the magnitude of electric field applied to in the thickness direction of the resin becomes high. An object of the present invention is to provide a cured resin sheet whose thermal conductivity, adhesive strength and insulation properties are all excellent, and a resin sheet and a resin composition which can form the cured resin sheet. Another object of the present invention is to provide a resin sheet laminate, a cured resin sheet laminate, a semiconductor device, and an LED device which are constituted by using the resin sheet.

Solution to Problem

Specific means for solving the problems are as follows:

<1> A resin composition including an epoxy resin monomer, a novolac resin containing a compound having a structural unit represented by the following general Formula (I), and a filler, in which a particle size distribution of the filler, measured using laser diffractometry, has peaks in the respective ranges of from 0.01 μm to less than 1 μm, from 1 μm to less than 10 μm, and from 10 μm to 100 μm, and the filler having particle sizes of from 10 μm to 100 μm contains boron nitride particles.

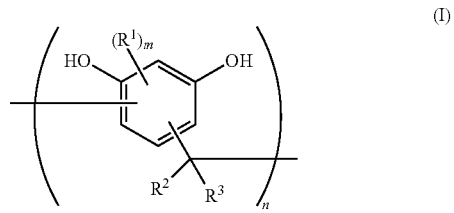

In the general Formula (I), $R^1$ represents an alkyl group, an aryl group, or an aralkyl group; each of $R^2$ and $R^3$ independently represents a hydrogen atom, an alkyl group, aryl group, or an aralkyl group; m represents a number from 0 to 2; and n represents a number from 1 to 7.

<2> A resin composition including an epoxy resin monomer, a novolac resin containing a compound having a structural unit represented by the following general Formula (I), a first filler having a volume-average particle size of from 0.01 μm to less than 1 μm, a second filler having a volume-average particle size of from 1 μm to less than 10 μm, and a third filler having a volume-average particle size of from 10 μm to 100 μm and containing a boron nitride particle.

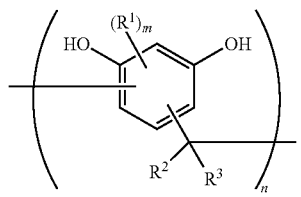

In the general Formula (I), $R^1$ represents an alkyl group, an aryl group, or an aralkyl group; each of $R^2$ and $R^3$ independently represents a hydrogen atom, an alkyl group, an aryl group, or an aralkyl group; m represents a real number from 0 to 2; and n represents a real number from 1 to 7.

<3> The resin composition according to the item <2>, in which the first filler contains an aluminum oxide particle.

<4> The resin composition according to the item <2> or <3>, in which a content of the first filler is from 1% by volume to 15% by volume, a content of the second filler is from 10% by volume to 40% by volume, and a content of the third filler is from 45% by volume to 80% by volume, based on a total volume of the first filler, the second filler and the third filler.

<5> The resin composition according to any one of the items <1> to <4>, in which the novolac resin further contains a phenol compound constituting a novolac resin, and a content ratio of the phenol compound is from 5% by mass to 50% by mass.

<6> A resin sheet formed by molding the resin composition according to any one of the items <1> to <5> into a sheet shape having an average thickness of from 80 μm to 250 μm.

<7> The resin sheet according to the item <6>, in which an arithmetic mean roughness of the surface thereof is from 1.0 μm to 2.5 μm.

<8> The resin sheet according to the item <6> or <7>, which is a laminate of a first resin layer and a second resin layer formed of the resin composition according to any one of Claims 1 to 5.

<9> The resin sheet according to the item <8>, further having a metal foil on one surface of the laminate, and further having a polyethylene terephthalate film on the other surface thereof.

<10> A cured resin sheet which is a thermally treated material of the resin sheet according to any one of the items <6> to <8>.

<11> A resin sheet laminate including the resin sheet according to any one of the items <6> to <8>, and a metal plate or a heat-dissipating plate disposed on at least one surface of the resin sheet.

<12> A cured resin sheet laminate which is a thermally treated material of the resin sheet laminate according to the item <11>.

<13> A method of producing a cured resin sheet laminate including a process in which a metal plate or a heat-dissipating plate is disposed on at least one surface of the resin sheet according to any one of the items <6> to <8>, and a process in which the resin sheet is heated to cure the resin sheet.

<14> A semiconductor device including a semiconductor element, and the cured resin sheet according to the item <10> which is disposed on the semiconductor element.

<15> An LED device in which an LED element, the cured resin sheet according to the item <10> and a substrate are laminated in this order.

Advantageous Effects of Invention

According to the present invention, there can be provided a cured resin sheet whose thermal conductivity, adhesive strength and insulation properties are all excellent, and a resin sheet and a resin composition which can form the cured resin sheet can. In particular, there can be provided a resin sheet having an excellent insulation property at high temperature and high humidity. Furthermore, according to the present invention, there can be provided a resin sheet laminate, a cured resin sheet laminate, a semiconductor device and an LED device which are constituted by using the resin sheet.

DESCRIPTION OF EMBODIMENTS

Figure 1:
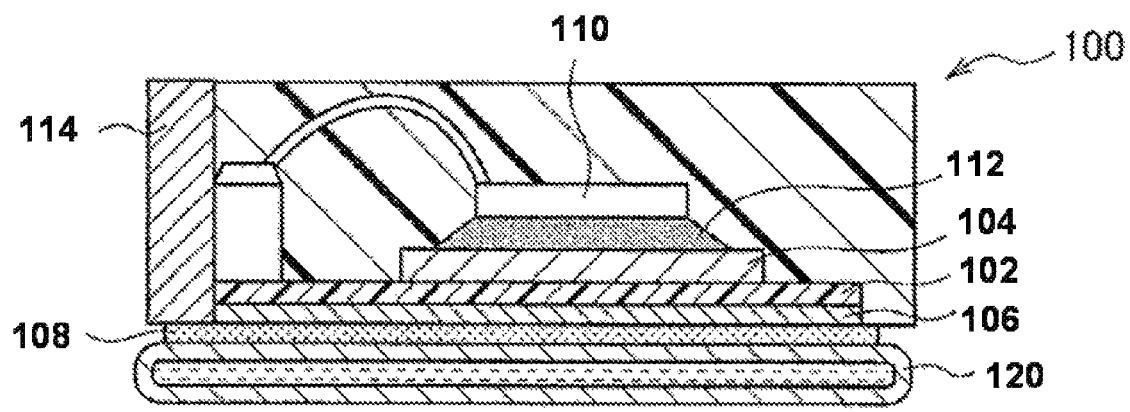
FIG. 1 is a schematic cross-sectional view illustrating one example of the structure of a power semiconductor device constituted by using a resin sheet according to the present invention.

The term "process" herein not only refers to an independent process but also refers to a process not clearly distinguished from other processes as long as an expected effect thereof is attained. A numerical range described using the term "to" means a range including numerical values before and after "to" as a minimum value and a maximum value, respectively. Further, when there exist plural corresponding substances for each component in the composition, the amount of each component in the composition refers to the total amount of the plural substances present in the composition, unless otherwise specified.

<Resin Composition>

A resin composition according to a first embodiment of the present invention includes an epoxy resin monomer, a novolac resin containing a compound having a structural unit represented by the following general Formula (I), and a filler, in which a particle size distribution of the filler, measured using laser diffractometry, has peaks in the respective ranges of from 0.01 µm to less than 1 µm, from 1 µm to less than 10 µm and from 10 µm to 100 µm; and a filler having particle size of from 10 µm to 100 µm contains a boron nitride particle. The resin composition may further contain other components as needed.

A resin composition according to a second embodiment of the present invention contains an epoxy resin monomer, novolac resin containing a compound having a structural unit represented by the following general Formula (I), a first filler having a volume-average particle size of from 0.01 µm to less than 1 µm, a second filler having a volume-average particle size of from 1 µm to less than 10 µm, and a third filler having a volume-average particle size of from 10 µm to 100 µm and which contains a boron nitride particle. The resin composition may further contain other components as needed.

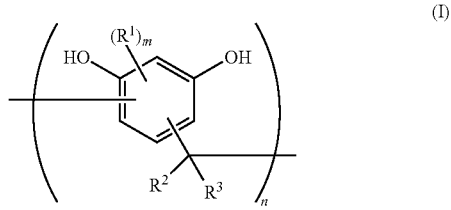

In the general Formula (I), $R^1$ represents an alkyl group, an aryl group, or an aralkyl group. Each of $R^2$ and $R^3$ independently represents a hydrogen atom, an alkyl group, an aryl group, or an aralkyl group. m represents a number from 0 to 2; and n represents a number from 1 to 7.

A resin sheet containing a resin composition having such a structure has excellent insulation properties before curing, and excellent adhesive properties to a metal plate or a heat-dissipating plate. By subjecting such a resin sheet to a thermal treatment to be heat set, a cured resin sheet whose thermal conductivity, adhesive properties and insulation properties are all excellent can be constituted. In particular, the resin sheet has excellent insulation properties under high temperature and high humidity. The above can be explained, for example, as follows.

Namely, it is conceivable that, by containing an epoxy resin monomer and a novolac resin having a specified structure, high adhesive properties and insulation properties before setting are obtained. It is also conceivable that, while the adhesive strength and insulation properties are maintained by the combination of an epoxy resin monomer and a novolac resin having a specified structure, the particle size distribution measured using laser diffractometry has peaks in the respective ranges of from 0.01 µm to less than 1 µm, from 1 µm to less than 10 µm, and from 10 µm to 100 µm, and a filler having a particle size of from 10 µm to 100 µm contains a boron nitride particle, whereby a particularly excellent thermal conductivity can be obtained due to the effect of the formation of a thermally conductive path of the filler after setting by a thermal treatment.

In a B stage state, a novolac resin having a high polarity molecular skeleton conceivably has a favorable adhesiveness with respect to a metal plate. This is conceivably because there are many hydroxyl groups in the novolac resin, which produce hydrogen bonds to obtain a high viscosity, and an electrostatic interaction with a metal oxide on the surface of a metal plate is likely to occur. The existence of a methylene skeleton which easily rotates between benzene rings facilitates change in the direction of the benzene ring skeleton. For this reason, a functional group can be directed to the surface of the metal plate, which conceivably makes the wettability favorable. Further, by using a novolac resin having a monomer fraction or a molecular weight distribution in a range in which the novolac resin does not flow too much, more favorable wettability and adhesiveness of a resin can be obtained. It is conceivable that since the resin wettability of an adhesive interface is good, an adhesive interfacial void which is likely to be the cause of a short-term electrical breakdown hardly occurs, which conceivably can improve the breakdown voltage.

Further, it is conceivable that, in a C stage state, a hydroxyl group forms a coordinate bond with a metallic atom on the surface of a metal plate made of copper, aluminum or the like, whereby a favorable adhesive strength can be obtained. The novolac resin has characteristics such that since the equivalent amount of hydroxyl groups is small and hydroxyl groups are not adjacent to each other, steric hindrance scarcely occurs, and the novolac resin has a structure by which a cross linking reaction is likely to occur. For this reason, in the C stage state, since a resin has a high crosslink density, a cured material having a high modulus of elasticity and a high thermal conductivity, into which moisture hardly penetrates, can conceivably be formed. Further, it is conceivable that since the surface of the aluminum oxide is metal oxide, it has basicity and easily forms a coordinate bond with a hydroxyl group of a novolac resin, whereby the resin and the filler can be favorably adhered to each other at the interface therebetween. Further, effects are conceivable such that scattering of a phonon which is a thermally conductive medium hardly occurs, whereby the thermal resistance is small, and such that moisture hardly penetrates into the resin.

If a filler having a volume-average particle size of from 10 µm to 100 µm contains a boron nitride particle, the thermal conductivity can be dramatically improved together with the effect of high thermal conductivity of a resin. Boron nitride, whose Mohs hardness is 2, which is lower than that of other insulating ceramics such as alumina or aluminum nitride (for example, hardness 8), is characterized in that it is soft and easy to be deformed. When an external force is applied during the formation of a resin, a boron nitride particle having a relatively large particle size in the resin sheet is deformed, and by removing resin present between the fillers during the deformation, the fillers can easily be close to each other. For this reason, it becomes easy to form a structure in which boron nitride particles are continuous in the resin sheet, thereby improving the thermal conductivity. Further, by filling the surroundings of boron nitride particles having a relatively large particle size with a filler having a smaller particle size, the filling rate can be increased, and the thermally conductive path can be widened, thereby increasing the thermal conductivity.

The resin composition according to the first embodiment can be constituted, for example, by containing an epoxy resin monomer, a novolac resin containing a compound having a structural unit represented by the above-mentioned general Formula (I), a first filler having a volume-average particle size of from 0.01 µm to less than 1 µm, a second filler having a volume-average particle size of from 1 µm to less than 10 µm, and a third filler having a volume-average particle size of from 10 µm to 100 µm and containing a boron nitride particle.

(Filler)

The resin composition contains a filler. The filler has peaks in the respective ranges of from 0.01 μm to less than 1 μm, from 1 μm to less than 10 μm, and from 10 μm to 100 μm in the particle size distribution measured using laser diffractometry, and contains a boron nitride particle having a particle size of from 10 μm to 100 μm. A filler having such as particle size distribution can be constituted, for example, by combining at least three types of fillers having a single peak in each particle size distribution. Specifically, for example, the filler may be constituted at least by containing a first filler having a volume-average particle size of from 0.01 μm to less than 1 μm, a second filler having a volume-average particle size of from 1 μm to less than 10 μm, a third filler having a volume-average particle size of from 10 μm to 100 μm and containing a boron nitride particle. The filler may also be constituted by combining plural fillers having two or more peaks in each particle size distribution. When the particle size distribution of the filler has the above constitution, the filling rate of the filler improves and the thermal conductivity improves more effectively.

The filler preferably contains at least three types of fillers having different volume-average particle sizes. In other words, the filler preferably at least contains a first filler having a volume-average particle size of from 0.01 μm to less than 1 μm, a second filler having a volume-average particle size of from 1 μm to less than 10 μm, and a third filler having a volume-average particle size of from 10 μm to 100 μm and containing a boron nitride particle. Preferably, the first filler contains an aluminum oxide particle.

The first filler has a volume-average particle size of from 0.01 μm to less than 1 μm, preferably from 0.05 μm to 0.8 μm from the viewpoint of dispersibility, and more preferably from 0.1 μm to 0.6 μm from the viewpoint of the filling property.

The second filler has a volume-average particle size of from 1 μm to less than 10 μm, preferably from 2 μm to 8 μm from the viewpoint of the resin melt viscosity, and more preferably from 2 μm to 6 μm from the viewpoint of the filling property.

Further, The third filler has a volume-average particle size of from 10 μm to 100 μm, preferably from 10 μm to 80 μm from the viewpoint of filler filling property, more preferably from 10 μm to 60 μm from the viewpoint of adhesive properties, further preferably from 15 μm to 55 μm, and particularly preferably from 20 μm to 50 μm. The volume-average particle size of the third filler is preferably 15μ or larger from the viewpoint of insulation properties, more preferably 20 μm or larger, and further preferably 30 μm or larger.

By containing three types of fillers having different volume-average particle sizes, the filling rate of the filler improves, and the thermal conductivity more effectively improves.

If the filler contains three types of fillers having different volume-average particle sizes in the above manner, when the particle size distribution of the total filler contained in the resin composition by setting the horizontal axis as the particle size and the vertical axis as the frequency, the filler can have a particle size distribution having peaks in the respective ranges of from 0.01 μm to less than 1 μm, from 1 μm to less than 10 μm and from 10 μm to 100 μm.

The particle size distribution of the filler can be measured by laser diffractometry. When using laser diffractometry, the measurement can be performed by firstly extracting a filler from a resin composition or a resin sheet (containing a cured material) and then using laser diffraction scattering particle size distribution measuring device (for example, LS 230, manufactured by Beckman Coulter, Inc.). Specifically, a filler component is extracted from a resin composition or a resin sheet by using an organic solvent or the like, nitric acid, aqua regia or the like, and sufficiently dispersed by an ultrasonic disperser or the like. By measuring the particle size distribution of this dispersion liquid, the particle size distribution of the filler can be measured. By calculating the volumes of the particles belonging to peaks in the particle size distribution of the filler, the volume contents of the particles belonging to each of the peaks in the total volume of the filler can be calculated.

Alternatively, by observing the cross section of a resin sheet or a cured material thereof by a scanning electron microscope, the particle size distribution of the filler can be measured. Specifically, by embedding the resin sheet or the cured material thereof into a transparent epoxy resin, and grinding them by a polisher, slurry, ion milling, FIB (focused ion beam), or the like, the cross section of the resin sheet or the cured material thereof is exposed. By directly observing the cross section by a scanning electron microscope, the particle size distribution of the filler can be actually measured. By using an FIB device (focused ion beam SEM), and performing grinding and two-dimensional cross-sectional observation repeatedly to perform a three-dimensional structure analysis, the particle size distribution of the filler can be measured. Further, by calculating the volumes of the particles belonging to peaks in the particle size distribution of the filler, the volume contents of the particles belonging to each of the peaks in the total volume of the filler can be calculated.

Figure 11:
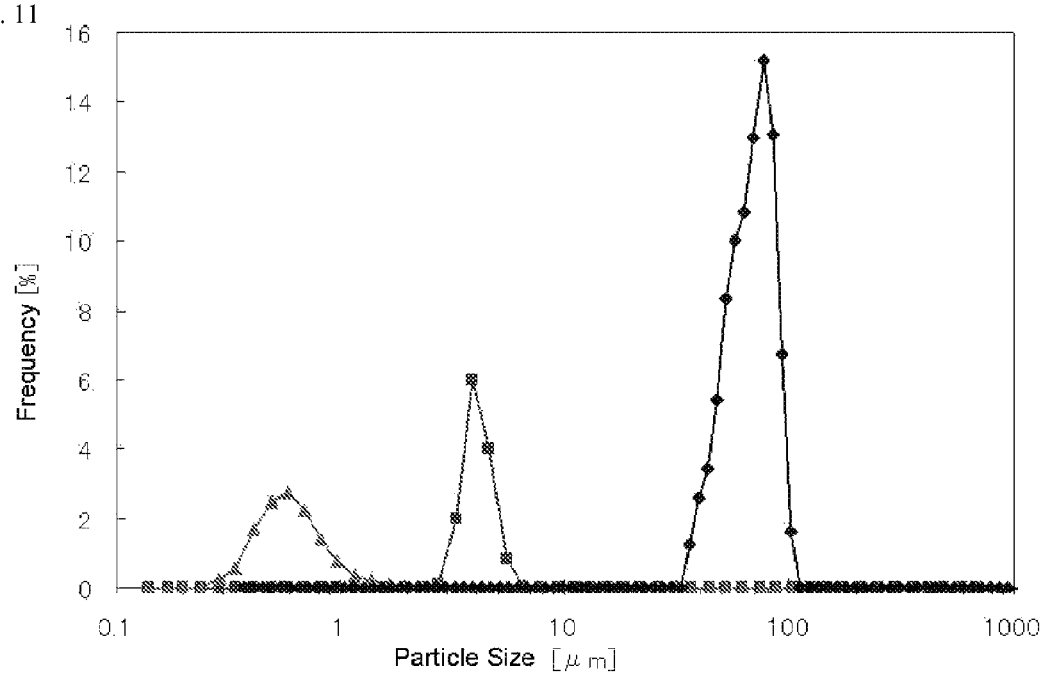
FIG. 11 is a diagram illustrating one example of the particle size distribution of fillers contained in a resin sheet according to the present invention.
Figure 12:
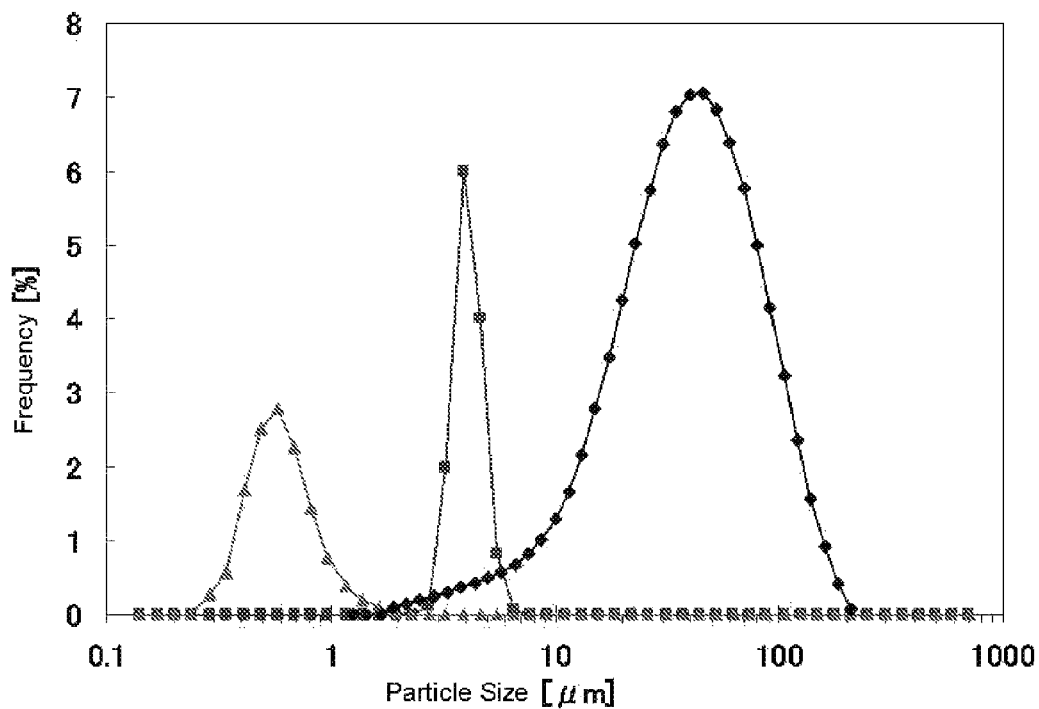
FIG. 12 is a diagram illustrating one example of the particle size distribution of fillers contained in a resin sheet according to the present invention.

FIG. 11 and FIG. 12 show one example of the particle size distribution of the fillers contained in the resin sheet. As shown in FIG. 11 and FIG. 12, there exist peaks of particle size distribution in a particle size range of from 0.01 μm to less than 1 μm, a particle size range of from 1 μm to less than 10 μm and a particle size range of from 10 μm to 100 μm. By constituting a resin sheet by using a resin composition containing fillers having such as particle size distribution, functions such as thermal conductivity and insulation properties can be sufficiently obtained.

Regarding the first filler, second filler and third filler, from the viewpoint of the thermal conductivity and the insulation properties, the volume-average particle size of the ratio of second filler with respect to the volume-average particle size of the first filler (the volume-average particle size of the second filler/the volume-average particle size of the first filler) is preferably from 5 to 50, and more preferably from the viewpoint of the filling property and the thermal conductivity, from 6 to 20. From the viewpoint of the thermal conductivity and the insulation properties, the ratio of the volume-average particle size of the third filler with respect to the volume-average particle size of the second filler (the volume-average particle size of the third filler/the volume-average particle size of the second filler) is preferably from 3 to 40, and more preferably from 5 to 30.

Regarding the first filler, second filler and third filler, the particle size distribution thereof is not particularly restricted as long as each has a predetermined volume-average particle size. The first filler, second filler and third filler preferably has a wide particle size distribution from the viewpoint of the thermal conductivity.

When the filler contains the first filler, second filler and third filler, the filler preferably contains the first filler, second filler and third filler as a whole. In other words, when the particle size distribution of the filler as a whole is measured, preferably at least three peaks, a peak corresponding to the first filler having a volume-average particle size of from 0.01 μm to less than 1 μm, a peak corresponding to the second filler having a volume-average particle size of from 1 μm to less than 10 μm, and a peak corresponding to the third filler having a volume-average particle size of from 10 μm to 100 μm are observed.

The filler according to such an embodiment may be constituted by combining, for example, the first filler, second filler and third filler each having a single peak in the particle size distribution, and may also be constituted by appropriately combining fillers having two or more peaks in the particle size distribution.

The content of the first filler, second filler and third filler in the filler is not particularly restricted. Regarding the content of each filler, from the viewpoint of improving more effectively thermal conductivity, preferably the content ratio of the third filler is as high as possible, and secondly the content ratio of the second filler is high. By adjusting the content ratio (based on volume) of at least three types of fillers having different volume-average particle sizes in such a manner, the thermal conductivity is more effectively improved. Specifically, regarding the content of the first filler, second filler and third filler based on volume in the total volume of the filler, preferably, the content of the first filler is from 1% by volume to 15% by volume, the content of the second filler is from 10% by volume to 40% by volume, and the content of the third filler is from 45% by volume to 80% by volume. More preferably, from the viewpoint of the thermal conductivity, the content of first filler is from 6% by volume to 15% by volume, the content of second filler is from 18% by volume to 35% by volume, and the content of third filler is from 50% by volume to 70% by volume. Further preferably, from the viewpoint of the filler filling property, the content of the first filler is from 7% by volume to 12% by volume, the content of the second filler is from 20% by volume to 30% by volume, and the content of the third filler is from 55% by volume to 70% by volume.

Regarding the content of each filler, from the viewpoint of the filling property and the thermal conductivity, preferably, the ratio of the content of the second filler with respect to the content of the first filler is from 0.5 to 40, and the ratio of the content of the third filler with respect to the content of the first filler is from 3 to 80; more preferably, the ratio of the content of the second filler with respect to the content of the first filler is from 1 to 7, and the ratio of the content of the third filler with respect to the content of the first filler is from 4 to 15; further preferably, the ratio of the content of the second filler with respect to the content of the first filler is from 1.5 to 4.5, and the ratio of the content of the third filler with respect to the content of the first filler is from 4.5 to 10.

Regarding the filler, from the viewpoint of the filling property and the thermal conductivity, preferably, the volume-average particle sizes of the first filler, second filler and third filler are from 0.01 μm to less than 1 μm, from 1 μm to less than 10 μm and from 10 μm to 100 μm, respectively; and the contents of the first filler, second filler and third filler based on volume are from 1% to 15%, from 10 to 40 and 45 to 80%, respectively. More preferably, the volume-average particle size of the first filler, second filler and third filler are from 0.05 μm to less than 0.8 μm, from 2 μm to less than 8 μm and from 20 μm to 80 μm; the contents of the first filler, second filler and third filler based on volume are from 5% to 13%, from 15% to 35% and from 50% to 73%, respectively. Further preferably, the volume-average particle sizes of the first filler, second filler and third filler are from 0.1 μm to less than 0.6 μm, from 2 μm to less than 6 μm and from 30 μm to 60 μm, respectively, and the contents of the first filler, second filler and third filler based on volume are from 7% to 13%, from 20% to 30% and from 55% to 70%, respectively.

The filler contains a boron nitride particle having a particle size of from 10 μm to 100 μm. The boron nitride particle is preferably contained in the filler as the third filler. When the filler contains a boron nitride particle having a particle size of from 10 μm to 100 μm, the thermal conductivity dramatically improves. The particle shape of the boron nitride particle is not particularly restricted, and examples thereof include a spherical shape, a round shape, a fracture shape, and a scale shape. It is also preferable that the boron nitride particle is an aggregate particle. The particle shape of the boron nitride particle is, from the viewpoint of the filling property and the thermal conductivity, preferably a spherical shape or a round shape, and more preferably an aggregate particle having a spherical shape or a round shape.

The above can be explained, for example, as follows. Boron nitride, whose Mohs hardness is 2 which is lower than that of other insulating ceramics such as alumina or aluminum nitride (for example, hardness 8), is soft. Further, boron nitride having a particle shape such as a spherical shape or a round shape forms to be a shape in which primary particles are aggregated, whereby a cavity exists inside the particle. Although the boron nitride is harder than molten resin, the particle itself is easy to deform. For this reason, the boron nitride is easy to be deformed by an external force, and can be deformed during the below-mentioned heating and pressurizing process, laminating process, and pressing process. During such deformation, resin between the fillers can be removed. For this reason, fillers can be easily close to each other, which makes easy to form a structure in which boron nitride particles are continuously in contact inside the resin sheet and cured resin sheet, conceivably resulting in dramatic improvement in the thermal conductivity. Although aluminum nitride is known as a filler having a higher thermal conductivity than that of boron nitride, aluminum nitride is hard as a particle and hard to be deformed, and a continuous layer is hard to be generated, whereby the effect of improving the thermal conductivity is conceivably smaller than boron nitride.

The content of boron nitride particle contained in the filler is not particularly restricted. From the viewpoint of thermal conductivity, when the total volume of the filler is 100% by volume, the content of boron nitride particle is preferably 15% by volume to 90% by volume, from the viewpoint of adhesive properties, more preferably 30% by volume to 85% by volume, and from the viewpoint of thermal conductivity, further preferably 35% by volume to 80% by volume.

When the filler contains boron nitride particle, the method of directly observing inside the resin composition or the tissue of a sheet by a microscope is effective. For example, by observing the cross section of a resin sheet or a cured material thereof by SEM (scanning electron microscope), the crystal form of the filler in the resin composition can be confirmed, and further, by using SEM-EDX (energy dispersed X-ray spectrometer), the element of the filler can be confirmed by a qualitative analysis.

The third filler may further contain an inorganic compound particle having other insulation properties in addition to the boron nitride particle. Examples of inorganic compounds having other insulation properties other than boron nitride which the third filler can contain include those similar to the below-mentioned first filler and second filler.

On the other hand, the first filler and second filler are not particularly restricted as long as they are an inorganic compound particle having insulation properties. The inorganic compound particle preferably has a high thermal conductivity. Specific examples of first filler and second filler include inorganic compound particles such as aluminum oxide, magnesium oxide, boron nitride, aluminum nitride, silicon nitride, talc, mica, aluminum hydroxide, and barium sulfate. Among these, from the viewpoint of the thermal conductivity and insulation properties, the inorganic compound particle is preferably inorganic compound particle which is at least one selected from the group consisting of aluminum oxide, boron nitride, and aluminum nitride. For these materials of a filler, one single material may be used, or two or more types of materials may be used.

The first filler preferably contains aluminum oxide particles. As a result, moisture resistance and insulation properties can be increased. The reason therefor is thought to be as follows. It is known that in a cured thermally conductive resin which is in contact with metal copper, a tree-like copper migration which occurs under a constant temperature and a constant humidity occurs along the interface of a resin and a filler having different dielectric constants. For this reason, by increasing the specific surface area of the filler, strengthening the bond of the interface between the filler and the resin, and heightening the crosslink density of the resin, the speed of progress of the tree-like copper migration can conceivably be reduced, and a resin composition having excellent long-term insulation reliability can conceivably be achieved. Here, since the first filler having the smallest particle size has the largest surface area per mass, this influences the moisture resistant reliability. Accordingly, if the first filler contains an aluminum oxide particle having excellent binding ability with a resin, the insulation reliability can conceivably be further improved. Further, since the aforementioned cured material using a novolac resin has a high crosslink density, the progress of the tree-like copper migration conceivably becomes even more difficult.

When the first filler contains an aluminum oxide particle, from the viewpoint of moisture resistant reliability, the aluminum oxide particle preferably has a specific surface area of 2 m²/g or larger. From the viewpoint of the moisture resistant reliability, it is also preferable that the aluminum oxide is an aluminum oxide particle having a purity of 99% by mass or higher.

The particle shape of the filler is not particularly restricted and examples thereof include a spherical shape, a round shape, a fracture shape, a scale shape, an aggregate particle shape or the like. The first filler and second filler are, from the viewpoint of filling property and thermal conductivity, preferably a round shape, a spherical shape or an aggregate particle shape.

The filler content in the resin composition is not particularly restricted. The filler content is, from the viewpoint of the thermal conductivity and the adhesive properties, preferably from 50% by volume to 90% by volume in the total solid volume of the resin composition; and more preferably, from the viewpoint of the thermal conductivity, from 50% by volume to 85% by volume. The term "total solid volume of resin composition" herein refers to the total volume a nonvolatile component among the components constituting the resin composition.

(Novolac Resin)

The resin composition contains a novolac resin containing at least one of compounds having a structural unit represented by the following general Formula (I) (hereinafter, also referred to as "specified novolac resin"). The novolac resin acts as, for example, a curing agent, reacts with the below-mentioned epoxy resin monomer to form a cured resin, and exhibits the insulation properties and the adhesive properties. By containing a novolac resin containing a compound having a specified structure, and a filler containing boron nitride and aluminum oxide, the resin composition can exhibit the insulation properties and the adhesive properties before curing, and excellent thermal conductivity, insulation properties and adhesive properties after curing. The specified novolac resin preferably further contains a monomer which is a phenol compound constituting the novolac resin.

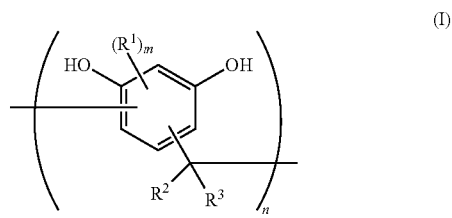

In the above-mentioned general Formula (I), $R^1$ represents an alkyl group, an aryl group, or an aralkyl group. An alkyl group, aryl group, and an aralkyl group represented by $R^1$ may further have a substituent if possible. Examples of the substituent include an alkyl group, an aryl group, a halogen atom, and a hydroxyl group.

m represents a number form 0 to 2. When m is 2, two $R^1$s may be the same or different. m is, from the viewpoint of the adhesive properties and the thermal conductivity, preferably 0 or 1, and more preferably 0. n is a number from 1 to 7, and means the number of repeats which are structural units represented by the general Formula (I). When the specified novolac resin contains plural compounds having a structural unit represented by the general Formula (I), the average value of n is, from the viewpoint of adhesive properties and thermal conductivity, preferably 1.7 to 6.5, and more preferable 2.4 to 6.1.

The specified novolac resin contains at least one compound having a structural unit represented by the above-mentioned general Formula (I), and may contain two or more compounds having a structural unit represented by the above-mentioned general Formula (I).

Since the specified novolac resin contains a compound having a structural unit represented by the general Formula (I), the specified novolac resin at least includes a partial structure derived from a resorcinol as a phenol compound. The specified novolac resin may further contain at least one partial structure derived from a phenol compound other than resorcinol. Examples of the phenol compound other than resorcinol include phenol, cresol, catechol, hydroquinone, 1,2,3-trihydroxy benzene, 1,2,4-trihydroxy benzene, and 1,3,5-trihydroxy benzene. The novolac resin may contain one single partial structure or two or more partial structures derived therefrom. Here, a partial structure derived from a phenol compound refers to a monovalent or divalent group constituted by removing one or two hydrogen atoms from a benzene ring portion of a phenol compound. The position where a hydrogen atom is removed is not particularly limited.

In the specified novolac resin, the partial structure derived from a phenol compound other than resorcinol is, from the viewpoint of thermal conductivity, adhesive properties, preservation stability, preferably a partial structure derived from at least one selected from the group consisting of phenol, cresol, catechol, hydroquinone, 1,2,3-trihydroxy benzene, 1,2,4-trihydroxy benzene, and 1,3,5-trihydroxy benzene.

The content of a partial structure derived from resorcinol in the specified novolac resin is not particularly restricted. From the viewpoint of thermal conductivity, the content of the partial structure derived from resorcinol with respect to the total mass of the specified novolac resin is preferably 55% by mass or higher, and from the viewpoint of further higher thermal conductivity, the content is more preferably 80% by mass or higher. The upper limit of the content of a partial structure derived from resorcinol with respect to the total mass of the specified novolac resin is not particularly restricted. The upper limit is preferably, for example, 98% by mass or lower.

In the general Formula (I), each of $R^2$ and $R^3$ independently represents a hydrogen atom, an alkyl group, an aryl group, a phenyl group or an aralkyl group. An alkyl group, phenyl group, aryl group and an aralkyl group represented by $R^2$ and $R^3$ may further include a substituent if possible. Examples of the substituent include an alkyl group, an aryl group, a halogen atom, and a hydroxyl group.

$R^2$ and $R^3$ in the present invention is, from the viewpoint of the preservation stability and the thermal conductivity, preferably a hydrogen atom, an alkyl group, or an aryl group; more preferably a hydrogen atom, an alkyl group having from 1 to 4 carbon atoms, or an aryl group having from 6 to 10 carbon atoms; further preferably a hydrogen atom or a phenyl group; and particularly preferably a hydrogen atom. Further, from the viewpoint of heat-resisting property, it is also preferably that at least one of $R^2$ and $R^3$ is an aryl group having from 6 to 10 carbon atoms (more preferably a phenyl group).

The specified novolac resin is specifically preferably a novolac resin containing a compound having a structural unit represented by any one of the following general Formula (Ia) to general Formula (If).

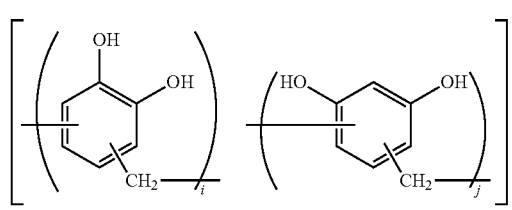
(Ia)

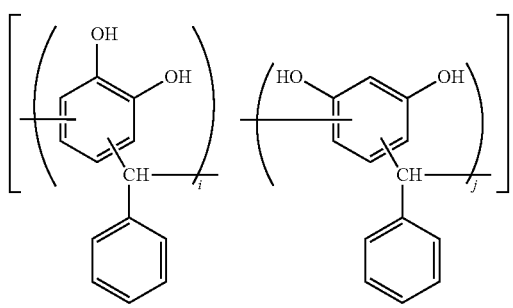
(Ib)

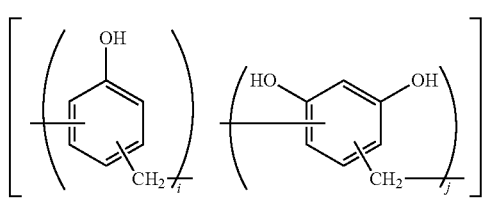
(Ic)

-continued

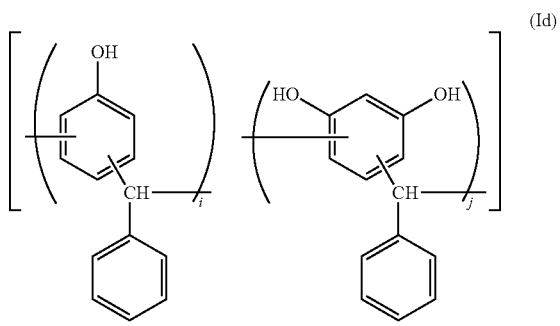
(Id)

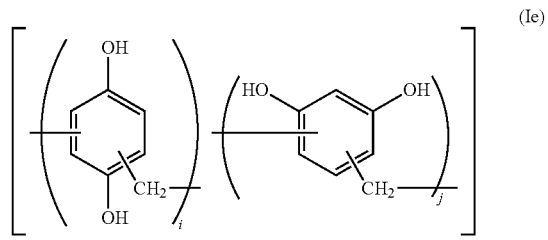
(Ie)

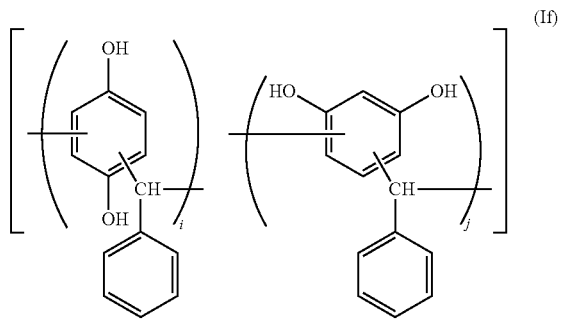
(If)

In the general Formulae (Ia) to (If), i nad j represent the content ratio (% by mass) of a structural unit derived from each phenol compound. i is from 2% by mass to from 30% by mass; j is 70% by mass to 98% by mass; and the sum of i and j is 100% by mass.

The specified novolac resin preferably includes a structural unit represented by either of the general Formula (Ia) and the general Formula (Ie), and i is from 2% by mass to 20% by mass and j is from 80% by mass to 98% by mass from the viewpoint of the thermal conductivity; and the specified novolac resin more preferably includes a structural unit represented by the general Formula (Ia), i is from 5% by mass to 10% by mass, j is from 90% by mass to 95% by mass from the viewpoint of modulus of elasticity and the coefficient of linear expansion.

The specified novolac resin contains a compound having a structural unit represented by the above-mentioned general Formula (I), and it is preferable that the specified novolac resin contains at least one compound represented by the following general Formula (III).

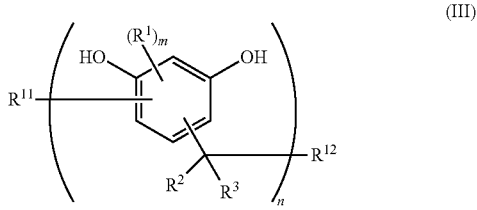

(III)

In the general Formula (III), $R^{11}$ represents a hydrogen atom or a monovalent group derived from a phenol compound represented by the following general Formula (IIIp), $R^{12}$ represents a monovalent group derived from a phenol compound. $R^1$, $R^2$, $R^3$, m and n have the same meaning as $R^1$, $R^2$, $R^3$, m and n in the general Formula (I) respectively. The monovalent group derived from a phenol compound represented by $R^{12}$ is a monovalent group constituted by removing one hydrogen atom from a benzene ring portion of a phenol compound, and the position where the hydrogen atom is removed is not particularly limited.

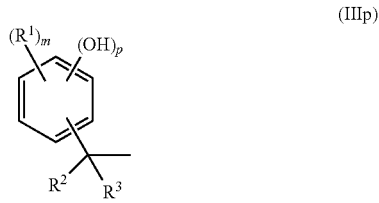

(IIIp)

In the general Formula (IIIp), p represents a number from 1 to 3. $R^1$, $R^2$, $R^3$ and m have the same meaning as $R^1$, $R^2$, $R^3$ and m in the general Formula (I).

A phenol compound regarding $R^{11}$ and $R^{12}$ is not particularly limited as long as the phenol compound is a compound having phenolic hydroxyl group. Specific examples thereof include phenol, cresol, catechol, resorcinol, and hydroquinone. Among these, from the viewpoint of thermal conductivity and preservation stability, at least one selected from the group consisting of cresol, catechol, and resorcinol is preferred.

Preferably, the number average molecular weight of the specified novolac resin is, from the viewpoint of the thermal conductivity or the moldability, 800 or less. From the viewpoint of modulus of elasticity and coefficient of linear expansion, the number average molecular weight of the specified novolac resin is more preferably from 300 to 750. Further, from the viewpoint of the moldability and the adhesive strength, the number average molecular weight of the specified novolac resin is more preferably from 350 to 550.

In the resin composition, the novolac resin containing a compound having a structural unit represented by the above-mentioned general Formula (I) may contain a monomer which is a phenol compound constituting a novolac resin. The content ratio a monomer which is a phenol compound constituting the novolac resin (hereinafter, also referred to as "monomer content ratio") is not particularly restricted. From the viewpoint of moldability, thermal conductivity, and glass transition temperature, the content ratio a monomer is preferably from 5% by mass to 50% by mass in the novolac resin; more preferably from 10% by mass to 45% by mass from the viewpoint of a high thermal conductivity or a glass transition temperature; and further preferably from 15% by mass to 40% by mass from the viewpoint of a further higher thermal conductivity and the glass transition temperature.

When the monomer content ratio is 5% by mass or higher, increase in the viscosity of the novolac resin is inhibited and a composition having a high adhesive strength or excellent thermal conductivity can be obtained. When the monomer content ratio is 50% by mass or lower, a three-dimensional cross-linked structure having a higher density and a higher order structure is formed by crosslinking reaction during curing, and more excellent thermal conductivity and heat-resisting property can be attained. On the other hand, when the monomer content ratio in the resin composition is 5% by mass or less, the resin is likely to have a high viscosity, which may reduce the moldability and the adhesive properties and may lower the thermal conductivity. When the monomer content ratio becomes higher than 50% by mass, the volatile content of the composition becomes high, whereby a void is likely to be generated. Namely, when the monomer content ratio is 5% by mass to 50% by mass, it becomes possible that the thermal conductivity, adhesive properties, and insulation properties are all excellent.

When the monomer content ratio of novolac resin in the resin composition is 5% by mass or higher, it was found that, when a resin sheet is constituted by a resin composition, the arithmetic mean roughness on the surface of the sheet is likely to become 2.5 μm or smaller. On the other hand, when the monomer content ratio of novolac resin in the resin composition is 50% by mass or smaller, it was found that the arithmetic mean roughness on the surface of the sheet is likely to become 1.0 μm or higher. In the above, the amount of monomer is correlated with the flowability during the formation of the resin sheet. When the monomer content ratio of novolac resin in the resin composition is in this range, interfacial voids are not accompanied with when a metal plate or the like is adhered to, whereby adhesion becomes possible. By using such a sheet, characteristics are obtained in which the insulation properties or adhesive properties, and, during curing, the thermal conductivity are more favorable. From the above, it is speculated that the monomer content ratio in the resin composition is correlated with the surface roughness of the sheet.

Examples of a method of measuring the monomer content ratio in the resin composition include a method in which a resin composition is dissolved and an organic component is extracted, and the obtained extract is quantified by using NMR (nuclear magnetic resonance) or HPLC (high-performance liquid chromatography). Specifically, in a chart of NMR spectrum or an HPLC, a peak corresponding to a monomer contained in a novolac resin, a peak corresponding to a novolac resin, a peak corresponding to epoxy resin monomer or the like is individually quantified, and then the content of monomer contained in a novolac resin and the content of the other components are compared with each other, whereby the monomer content ratio is determined. Spectrum data of organic components such as phenol compound, and epoxy resin monomer are disclosed at a public research organization, and by comparing therewith, identification and quantification can be performed.

Examples of a monomer which is a phenol compound constituting the novolac resin preferably include resorcinol, catechol, and hydroquinone. Preferably, at least resorcinol is contained as a monomer constituting the novolac resin.

The resin composition may contain at least one of other curing agents in addition to the novolac resin containing a compound represented by the general Formula (I) (specified novolac resin). The other curing agents are not particularly restricted as long as they are a compound which can form a cured resin by reacting with an epoxy resin monomer. Specifically, for example, a polyaddition curing agent such as a novolac resin (excepting those containing a compound represented by the general Formula (I)), an aromatic amine curing agent, an aliphatic amine curing agent, a mercaptane curing agent, or an acid anhydride curing agent or the like can be used. In addition to these curing agents, a curing catalyst such as imidazole, triphenylphosphine, and derivatives thereof in which a side chain is introduced into such a compound can be used.

Regarding the other curing agent, from the viewpoint of the insulation properties and the heat-resisting property, it is preferable that at least one of the other novolac resin which does not contain a compound represented by the general Formula (I). The other novolac resins are not particularly restricted as long as they are a novolac resin which does not contain a compound represented by the general Formula (I), and can be appropriately selected from novolac resins which are commonly used as a curing agent for an epoxy resin.

When the resin composition further contains the other curing agent, the content of the other curing agent is not particularly restricted. From the viewpoint of the thermal conductivity, the content of the other curing agent is preferably 30% by mass or less with respect to the specified novolac resin, and more preferably 5% by mass or less.

The total content of specified novolac resin and other curing agents in the resin composition which are contained as needed (hereinafter, also generally, simply referred to as "curing agent") is not particularly restricted. From the viewpoint of the thermal conductivity and the adhesive properties, the total content is preferably from 1% by mass to 10% by mass with respect to the total solid of the resin composition, and more preferably from 1% by mass to 8% by mass. The content of the curing agent in the resin composition is preferably from 0.8 to 1.2 with respect to the below-mentioned epoxy resin monomer based on equivalent, and more preferably from 0.9 to 1.1.

(Epoxy Resin Monomer)

The resin composition in the present invention contains at least one of epoxy resin monomers (hereinafter, also simply referred to as "epoxy resin"). As the epoxy resin, common epoxy resins which are commonly used can be used without particular restriction. Among others, it is preferable that the epoxy resin has a low viscosity before curing, and has an excellent filler filling property or moldability, and, after heat setting, has a high thermal conductivity in addition to a high heat-resisting property or adhesive properties.

When the epoxy resin monomer forms a cured resin together with a novolac resin having a specified structure, a highly ordered higher order structure derived from a covalent bond or an intermolecular force can be formed in the cured resin. For this reason, scattering of a phonon which is a thermal conductive medium can be restricted. For this reason, a high thermal conductivity can conceivably be attained.

Specific examples of a common epoxy resin include a bisphenol A type, F type, S type, AD type glycidyl ether, a hydrogenated bisphenol A type glycidyl ether, a phenol novolac type glycidyl ether, a cresol novolac type glycidyl ether, a bisphenol A type novolac type glycidyl ether, naphthalene type glycidyl ether, biphenol type glycidyl ether, dihydroxypentadiene type glycidyl ether, triphenylmethane type epoxy resin, phenol novolac type epoxy resin, and cresol novolac type epoxy resin.

The epoxy resin monomer is preferably those having a low viscosity, an excellent filler filling property or moldability before curing, and having a high thermal conductivity in addition to a high heat-resisting property or adhesive properties after heat setting. For example, it is preferable that an epoxy resin monomer which is in a liquid state at 25° C. For this reason, flexibility during forming a sheet or flowability during lamination is easily obtained. Examples of such an epoxy resin monomer which is liquid at 25° C. include bisphenol A type, AD type or hydrogenated resin thereof or naphthalene thereof, a resin having an epoxy group on one end which is referred to as reactive diluent, and from the viewpoint of the change of modulus of elasticity with respect to temperature after curing or thermophysical properties, bisphenol A type or AD type, naphthalene type are preferred.

The molecular weight of the above-mentioned epoxy resin monomer which is liquid at 25° C. is not particularly restricted, and for example, from the viewpoint of flowability during lamination, the molecular weight is preferably from 100 to 100000, more preferably from 200 to 50000, and particularly preferably from 300 to 10000.

Particularly, when at least one liquid epoxy resin selected from the group consisting of a bisphenol A type glycidyl ether having a molecular weight of 500 or lower and a bisphenol F glycidyl ether is contained, the flexibility during forming a sheet or flowability during lamination can be further improved.

Particularly, when at least one liquid epoxy resin selected from the group consisting of a bisphenol A type glycidyl ether having a molecular weight of 500 or lower and a bisphenol F glycidyl ether is contained, flowability during lamination can be further improved.

The epoxy resin monomer may contain a polyfunctional epoxy resin. For this reason, a high Tg (glass transition temperature) and high thermal conductivity can more effectively attained. Preferred examples of the polyfunctional epoxy resin include a phenol novolac epoxy resin, a cresol novolac type epoxy resin, a triphenylmethane epoxy resin.

The epoxy resin monomer may contain, from the viewpoint of the thermal conductivity, an epoxy resin monomer having a mesogenic group.

The mesogenic group here is not particularly restricted as long as the group can form a higher order structure derived from a mesogenic group in the cured resin when the epoxy resin monomer forms a cured resin together with a curing agent. The term "higher order structure" herein refers to a state in which molecules are oriented after the resin composition is cured. The state is, for example, that there exists a crystal structure or a liquid crystal structure in the cured resin. The presence of such crystal structure or liquid crystal structure can be directly confirmed by, for example, polarizing microscope observation under crossed Nicols or X ray scattering spectrum. By decrease in change in the storage elastic modulus with respect to the change in temperature, the presence thereof can be confirmed indirectly.

Specific example of the mesogenic group include a biphenyl group, a terphenyl group, a terphenyl analogue, an anthracene group, and a group formed by connecting these groups by an azomethine group, an ester group or the like.

In the present invention, by using as the epoxy resin monomer an epoxy resin monomer having a mesogenic group, and constituting a cured resin together with a curing agent, a further higher thermal conductivity can be attained. The above can be explained, for example, as follows. If an epoxy resin monomer having a mesogenic group in the molecule forms a cured resin together with a curing agent (preferably, specified novolac resin), a highly ordered higher order structure derived from a mesogenic group can be formed in the cured resin. For this reason scattering of a phonon which is a thermal conductive medium can be restricted. For this reason, a high thermal conductivity can conceivably be attained.

Specific examples of an epoxy resin monomer having the mesogenic group include 4,4'-biphenol glycidyl ether, 1-{(3-methyl-4-oxiranyl methoxy)phenyl}-4-(4-oxiranyl methoxy phenyl)-1-cyclohexene, 4-(oxiranyl methoxy)benzoic acid-1,8-octane diylbis(oxy-1,4-phenylene)ester and 2,6-bis[4-[4-[2-(oxiranyl methoxy)ethoxy]phenyl]phenoxy]pyridine. Among these, from the viewpoint of improving the thermal conductivity, 1-{(3-methyl-4-oxiranyl methoxy)phenyl}-4-(4-oxiranyl methoxy phenyl)-1-cyclohexene is particularly preferred.

The epoxy resin may contain a liquid epoxy resin. For this reason, the resin softening point of a resin sheet in an A stage state or B stage state can be reduced. Specifically, there are cases where the flexibility of and handling property of a sheet are improved, and the melt viscosity during adhesion may be reduced. Since, however, there are cases where the liquid epoxy resin has a low Tg or a low thermal conductivity, the content of a liquid epoxy resin can be appropriately selected in consideration of the physical properties of a cured resin. Specific examples of the liquid epoxy resin are as mentioned above.

The content of an epoxy resin monomer in the resin composition is not particularly restricted. From the viewpoint of the thermal conductivity and adhesive properties, the content of an epoxy resin monomer in the resin composition is, in the total solid constituting the resin composition, preferably from 3% by mass to 30% by mass; from the viewpoint of the thermal conductivity, more preferably from 5% by mass to 25% by mass; and further preferably from 5% by mass to 20% by mass.

The resin composition preferably contains, from the viewpoint of the thermal conductivity and high modulus of elasticity, as the epoxy resin monomer, an epoxy resin monomer having a mesogenic group, in an amount of from 3% by mass to 30% by mass with respect to the total solid of the resin composition; and more preferably contains an epoxy resin monomer having at least one mesogenic group selected from the group consisting of 4,4'-biphenol glycidyl ether, 1-{(3-methyl-4-oxiranyl methoxy)phenyl}-4-(4-oxiranyl methoxy phenyl)-1-cyclohexene, 4-(oxiranyl methoxy)benzoic acid-1,8-octane diylbis(oxy-1,4-phenylene)ester and 2,6-bis[4-[4-[2-(oxiranyl methoxy)ethoxy]phenyl]phenoxy]pyridine in an amount of from 5% by mass to 25% by mass with respect to the total solid of the resin composition.

The resin composition preferably contains, from the viewpoint of the thermal conductivity and the heat-resisting property, as the epoxy resin monomer, at least one selected from the group consisting of phenol novolac epoxy resin, cresol novolac epoxy resin and triphenylmethane epoxy resin and at least one selected from bisphenol A type glycidyl ether and bisphenol AD type glycidyl ether, in which a mass ratio is from 85:15 to 85:15, in an amount of from 3% by mass to 30% by mass with respect to the total solid of the resin composition; and more preferably contains at least one selected from the group consisting of a triphenylmethane epoxy resin and at least one selected from bisphenol A type glycidyl ether and bisphenol F type glycidyl ether, in which a mass ratio is from 70:30 to 30:70, in an amount of from 5% by mass to 25% by mass with respect to the total solid of the resin composition.

(Silane Coupling Agent)

The resin composition may further contain at least one silane coupling agent. By containing a silane coupling agent, the binding ability between a resin component containing an epoxy resin and a novolac resin and a filler further improves, and a higher thermal conductivity and stronger adhesive properties can be attained.

The silane coupling agent is not particularly restricted as long as it is a compound having a functional group which connects to a resin component and a functional group which connects to a filler, and a commonly used silane coupling agent is appropriately selected and used. Examples of the functional group which connects to a filler include a trialkoxysilyl group such as a trimethoxysilyl group and a triethoxysilyl group. Examples of the functional group which connects to the resin component include an epoxy group, an amino group, a mercapto group, a ureido group, and an aminophenyl group.

Specific examples of the silane coupling agent include 3-glycidoxypropyl trimethoxysilane, 3-glycidoxypropyl triethoxysilane, 3-glycidoxypropyl methyldimethoxysilane, 2-(3,4-epoxy cyclohexyl)ethyltrimethoxysilane, 3-aminopropyl triethoxysilane, 3-(2-aminoethyl)amino propyl triethoxysilane, 3-aminopropyltrimethoxysilane, 3-(2-aminoethyl)aminopropyltrimethoxysilane, 3-phenyl aminopropyltrimethoxysilane, 3-mercapto triethoxysilane, and 3-ureido propyl triethoxysilane. A silane coupling agent oligomer represented by SC-6000KS2 (manufactured by Hitachi Chemical Coated Sand Co., Ltd.) can also be used. These silane coupling agents can be used alone or two or more of these can be used in combination.

The content of silane coupling agent in the resin composition is not particularly restricted. The content of the silane coupling agent with respect to the total solid mass of resin composition is, from the viewpoint of the thermal conductivity, preferably from 0.02% by mass to 0.83% by mass, and more preferably from 0.04% by mass to 0.42% by mass.

The content of the silane coupling agent with respect to the content of the filler is, from the viewpoint of thermal conductivity, insulation properties, moldability, preferably from 0.02% by mass to 1% by mass; and more preferably, from the viewpoint of a higher thermal conductivity, from 0.05% by mass to 0.5% by mass.

(Other Components)

The resin composition can contain other components in addition to the above-mentioned essential component as needed. Examples of the other component include an organic solvent, a curing accelerator, and a dispersing agent.

(Method of Producing Resin Composition)

For a method of producing a resin composition, a commonly used method of producing a resin composition can be used without particular restriction. As a method of mixing an epoxy resin, a novolac resin and a filler, for example, common dispersers such as a stirrer, a grinding machine, a triple roll and a ball mill can be appropriately used in combination. By adding appropriate organic solvent, dispersion and dissolution can be performed.

Specifically, for example, a resin composition can be obtained by dissolving and dispersing an epoxy resin, a novolac resin, a filler, and a silane coupling agent to be added as needed in an appropriate organic solvent, and mixing a curing accelerator or the like and other components as needed.

Since at least a part of the organic solvent is removed by a drying treatment in the drying process of the below-mentioned method of producing a resin sheet, the organic solvent desirably has a low boiling point or a low vapor pressure. When a large amount of the organic solvent is left in the resin sheet, the thermal conductivity or insulation properties may be affected. On the other hand, when the organic solvent is removed completely, the sheet may become hard and the adhesive properties may be lost. The selection of the organic solvent is therefore need to be matched with a drying method and conditions. The organic solvent can be appropriately selected depending on the type of the resin used, the type of the filler, and the tendency of drying of sheet during the producing thereof. Examples of the organic solvent include alcohols such as methanol, ethanol, 1-propanol, 2-propanol, 1-butanol, 2-propanol, cyclohexanol; a ketone solvent such as methyl ethyl ketone, cyclohexanone, cyclopentanone; a nitrogen containing solvent such as dimethylformamide and dimethylacetamide. The organic solvents can be used alone or two or more of the organic solvents can be combined and used.

<Resin Sheet>

The resin sheet of the present invention is obtained by forming the resin composition into a sheet shape having an average thickness of from 80 μm to 250 μm. When a resin sheet is formed of the resin composition, the preservation stability before curing and the thermal conductivity after curing are excellent. Details of the resin composition are as mentioned above.

The average thickness of the resin sheet is from 80 μm to 250 μm, and the average thickness is preferably, from the viewpoint of the balance between the thermal conductivity and insulation properties, from 90 μm to 250 μm, more preferably from 100 μm to 250 μm, and further preferably from 110 μm to 230 μm. The average thickness of the resin sheet can be appropriately selected in consideration of electrical characteristics such as the insulation voltage or current value, and the thermal resistance value between the heating element and the sheet. If a needed thermal resistance value can be satisfied, from the viewpoint of insulation properties, the sheet thickness is preferably larger. The average thickness of the resin sheet is provided by using a micrometer (for example, manufactured by Mitutoyo Corporation Micrometer IP65) and measuring the thicknesses at nine points, as the arithmetic mean value thereof.

The arithmetic mean roughness on the surface of the resin sheet is, from the viewpoint of insulation properties including long-term reliability, preferably from 1.0 μm to 2.5 μm, and more preferably from 1.2 μm to 2.3 μm. Examples of a method of making the arithmetic mean roughness on the surface of a resin sheet in the above range include a laminating treatment, a pressing treatment, and a metal roll treatment. If the composition of the resin composition is appropriately selected, the arithmetic mean roughness can also be made in the above range. The arithmetic mean roughness on the surface of the resin sheet is measured by using a surface roughness measuring device (for example, Surface Roughness Measuring Instrument manufactured by Kosaka Laboratory Ltd.) in the measurement condition: 1 mm/s.

Preferably, the resin sheet further has a support on at least one surface thereof, and more preferably has supports on both surfaces thereof. For this reason, the resin composition can be protected from the attachment of foreign substance to the adhesion surface of the resin sheet from external environment or a impact. The support is preferably peeled from the resin composition at the appropriate times in use.

Examples of the support include plastic films such as a polytetrafluoroethylene film, a polyethylene terephthalate film, a polyethylene film, a polypropylene film, a polymethylpentene film, a polyimide film. These plastic films may be subjected to, as needed, a surface treatment such as a primer application, a UV treatment, a corona discharge treatment, a grinding treatment, an etching treatment, a mold release treatment. As the support, a metal foil such as a copper foil and an aluminum foil, or a metal such as an aluminum plate can be used.

When the support is a plastic film, the mean film thickness thereof is not particularly restricted. The mean film thickness is appropriately set depending on the average thickness of a resin sheet to be formed or the usage of the resin sheet based on the knowledge of those skilled in the art. The mean film thickness of the plastic film is, from the viewpoint of good economy and good handling property, preferably from 10 μm to 150 μm, and more preferably from 25 μm to 110 μm.

When the support is a metal foil, the mean film thickness thereof is not particularly restricted, and can be appropriately selected depending on the usage or the like of the resin sheet. The mean film thickness can be, for example, from 10 μm to 400 μm, and, from the viewpoint of the handling property of a roll foil thereof, preferably from 18 μm to 300 μm.

The resin sheet is preferably a laminate of a first resin layer formed of the resin composition and a second resin layer formed of the resin composition. In other words, the resin sheet is preferably formed by laminating a second resin layer formed of the resin composition on a first resin layer formed of the resin composition. For this reason, the insulation breakdown voltage can be further improved. A resin composition which forms the first resin layer and a resin composition which forms the second resin layer may have the same composition or different compositions from each other. The resin composition which forms the first resin layer and the resin composition which forms the second resin layer are, from the viewpoint of thermal conductivity, preferably the same composition.

It is preferable that the resin sheet is a laminate of the first resin layer formed from the resin composition and the second resin layer formed from the resin composition, and preferably further includes a metal foil on one surface of the laminate, and further includes a polyethylene terephthalate film on the other surface of the laminate. In other words, it is preferable that the resin sheet father includes a metal foil and a polyethylene terephthalate film, and preferable is formed by laminating the metal foil, first resin layer, second resin layer and polyethylene terephthalate film in this order. For this reason, a void filling effect is obtained, and there is a tendency that the insulation breakdown voltage is further improved.

(Method of Producing Resin Sheet)

The method of producing the resin sheet is not particularly restricted as long as a sheet shaped resin layer having an average thickness of from 80 μm to 250 μm can be formed by using the above-mentioned resin composition, and can be appropriately selected from commonly used sheet producing methods. Specific examples of the method of producing the resin sheet include a method in which a resin composition containing an organic solvent is applied on a support in a desired average thickness to form a coating layer and at least a part of the organic solvent is removed from the formed coating layer by drying treatment to form a resin layer.

The applying method and drying method of a resin composition are not particularly restricted and a commonly used method can be appropriately selected. Examples of the applying method include a comma coater method, a die coater method, and a dip coating method. Examples of the drying method include a drying by heating under a normal pressure, a natural drying or freeze-drying under reduced pressure.

The film thickness of the coating layer can be appropriately selected such that the resin layer after drying treatment has a desired average thickness. When the average thickness of the resin layer after drying is from 80 μm to 250 μm, the film thickness of the coating layer is preferably adjusted to from 90 μm to 230 μm. When the average thickness of the resin layer is 80 μm or larger, a cavity is hardly to be formed in the coating layer, and the producing likelihood tends to become large. When the average thickness of the resin layer is 250 μm or less, scattering of powder of the resin tends to be restricted even when a resin roll is formed.

The method of producing a resin sheet preferably include a process in which a laminate is obtained by laminating a second resin layer formed of the resin composition on a first resin layer formed of the resin composition, and a process in which the obtained laminate is subjected to a heat and pressure treatment. By such a producing method, the insulation breakdown voltage is further improved.

The above can be explained, for example, as follows. By laminating two resin layers, a portion where the film thickness is thin (pinhole or void) which may exist in one resin layer is compensated with the other coating layer. For this reason, the minimum insulation thickness can be made large, and the insulation breakdown voltage is conceivably more improved. In the method of producing a resin sheet, although the event probability of pinhole or void is not high, the probability of overlapping of thin portions is squared by laminating two resin layers, resulting in approximately zero in terms of probability. Since electrical breakdown occurs at a portion where the insulating properties are weakest, an effect of further improving the insulation breakdown voltage is conceivably obtained by laminating two resin layers. Further, the contact probability of fillers improves, and an effect of improving the thermal conductivity is conceivably generated.

Further, the process of obtaining the laminate is preferably a process in which a first resin layer formed of the resin composition provided on a metal foil and a second resin layer formed of the resin composition provided on a polyethylene terephthalate film are laminated such that the surface opposite to the surface in contact with the metal foil of the first resin layer and the surface opposite to the surface in contact with the polyethylene terephthalate film of the second resin layer are in contact with each other. For this reason, an effect of filling cavities is obtained more effectively.

The first resin layer can be formed, for example, in such a manner that a resin composition containing an organic solvent is applied on a metal foil to form a coating layer, and the formed coating layer is subjected to drying treatment to remove at least a part of the organic solvent. The second resin layer can be formed, for example, in such a manner that a resin composition containing an organic solvent is applied on a polyethylene terephthalate film to form a coating layer, and the formed coating layer is subjected to drying treatment to remove at least a part of the organic solvent.

The average thicknesses of the first resin layer and the second resin layer can be appropriately selected such that the average thickness of the laminate is from 80 μm to 250 μm when the laminate is constituted. The average thicknesses of the first resin layer and the second resin layer can be, for example, from 30 μm to 250 μm, and is preferably from 50 μm to 200 μm. When the average thickness is 50 μm or larger, a cavity (void) is hard to be formed in the coating layer, and there is a tendency that the producing likelihood becomes large. When the average thickness is 200 μm or less, there is a tendency that a crack is hard to be generated in the sheet. The average thicknesses of the first resin layer and second resin layer may be the same or different.

Further, a laminate formed by laminating the first resin layer and the second resin layer is preferably subjected to a heat and pressure treatment. For this reason, a resin sheet having an improved thermal conductivity can be produced. The method of heat and pressure treatment is not particularly restricted as long as the method is a method in which a predetermined pressure and heat can be applied, and can be appropriately selected from commonly used heat and pressure treatment methods. Specific examples thereof include a laminating treatment, a pressing treatment, and a metal roll treatment. Examples of the heat and pressure treatment include a method in which a treatment is performed under a normal pressure, and a vacuum treatment in which a treatment is performed under a reduced pressure. The vacuum treatment is preferred, which is not restrictive.

When a resin layer is formed by using the resin composition by application, the surface of the laminate before the heat and pressure treatment is uneven due to a filler or the like, which may be not smooth. The film thickness of the resin sheet obtained by subjecting such a laminate to a heat and pressure treatment may be different from the sum of the thicknesses of the resin layers formed by application and may be thinner than that. This is conceivably due to, for example, that the filler filling property changes before and after the heat and pressure treatment, that the convex of the surface and the concave of the surface are overlapped, that the uniformity of the sheet improves, and that a void is filled.

The resin sheet is preferably formed of a resin layer obtained by removing at least a part of the organic solvent from the coating layer. Further, it is preferable that a resin composition constituting a resin layer becomes a semi-cured state (B stage) by further subjecting the resin layer in which at least a part of organic solvent is removed to a heat and pressure treatment. Herein, in the present specification, a resin sheet obtained by drying a coating layer formed of a resin composition is sometimes referred to as "A stage sheet", and a resin sheet obtained by further subjecting the A stage sheet to a heat and pressure treatment is sometimes referred to as "B stage sheet".

The B stage sheet is preferably a state in which a resin composition is semi-cured state. Here, the B stage sheet is a sheet in which while the viscosity of the resin sheet is from $10^4$ Pa·s to $10^7$ Pa·s at normal temperature (25 degrees), the viscosity of the resin sheet at 100° C. is reduced to from $10^2$ Pa·s to $10^6$ Pa·s by 0.01 to 30%. The below-mentioned cured resin sheet after curing does not melt even by heating. The above-mentioned viscosity can be measured by dynamic viscoelastic measurement (frequency 1 Hz, weight 40 g, temperature rise 3° C./min.).

When the resin sheet is a B stage sheet, the handling property is improved. This is because the degree of curing is higher than that of A stage sheet and the modulus of elasticity is increased, which improves the strength. On the other hand, the degree of curing of the resin needs to be controlled such that the resin can be handled flexibly. Regarding a B stage sheet, examples of a method of making the resin layer into a semi-cured state include a method of the below-mentioned heat and pressure treatment.

The heat and pressure treatment of a resin sheet is not particularly restricted as long as the resin layer can be made into a semi-cured state. For example, heat and pressure treatment can be performed by using heat press or a laminator. Heating and pressurizing conditions for making a resin composition constituting the resin sheet into a semi-cured state can be appropriately selected depending on the constitution of the resin composition. For example, the heat and pressure treatment can be performed under conditions of heating temperature from 80° C. to 180° C., pressure from 0.1 MPa to 100 MPa, from 0.3 min to 30 min.

<Cured Resin Sheet>

The cured resin sheet of the present invention is a thermally treated material of the resin sheet. In other words, the cured resin sheet is formed by subjecting the resin sheet to a thermal treatment to cure a resin composition constituting the resin sheet. Accordingly, cured resin sheet includes a cured resin derived from an epoxy resin monomer and a novolac resin containing a compound having a structural unit represented by general Formula (I), and a filler which contains a boron nitride particle having a particle size of from 10 μm to 100 μm, and in which the particle size distribution measured using laser diffractometry has peaks in the respective ranges of from 0.01 μm to less than 1 μm, from 1 μm to less than 10 μm and from 10 μm to 100 μm.

The cured resin sheet preferably includes a cured resin derived from an epoxy resin monomer and a novolac resin containing a compound having a structural unit represented by the general Formula (I), a first filler having a volume-average particle size of from 0.01 μm to less than 1 μm, a second filler having a volume-average particle size of from 1 μm to less than 10 μm, and a third filler having a volume-average particle size of from 10 μm to 100 μm and containing a boron nitride particle.

The cured resin sheet exhibits a high thermal conductivity because the third fillers are in contact with each other. In a mixture of a resin and a filler, which have different thermal conductivities, it is preferable that the fillers having a high thermal conductivity are as close to one another as possible. For example, when the third fillers or the first filler and the second filler and the third filler are in contact with each other without mediating a resin therebetween, a path which can easily conduct heat can be formed, whereby a high thermal conductivity can easily be obtained.

The thermal treatment conditions during a cured resin sheet is produced can be appropriately selected depending on the constitution of the resin composition. For example, a heat treatment can be performed at from 120° C. to 250° C. for from 10 min to 300 min. From the viewpoint of the thermal conductivity, a heat treatment including a temperature at which a cured resin is likely to form a higher order structure or a three-dimensional cross-linked structure is preferable. For example, at least two steps of heating, from 100° C. to 160° C. and from 160° C. to 250° C. are more preferably performed. Further, it is further preferable that, in the above-mentioned temperature range, a multistep heat treatment having two or more steps is performed.

<Resin Sheet Laminate>

The resin sheet laminate of the present invention includes the resin sheet, and a metal plate or a heat-dissipating plate disposed at least one surface of the resin sheet. The details of the resin sheet constituting the resin sheet laminate is as mentioned above. Examples of the metal plate or the heat-dissipating plate include a copper plate, an aluminum plate, and a ceramic plate. The thickness of the metal plate or the heat-dissipating plate is not particularly limited. For the metal plate or the heat-dissipating plate, a metal foil such as a copper foil or an aluminum foil may be used.

In the resin sheet laminate, although a metal plate or a heat-dissipating plate is disposed on at least one surface of the resin sheet, it is preferable that a metal plate or a heat-dissipating plate is disposed on both the surfaces. The method of disposing a metal plate or a heat-dissipating plate on a resin sheet may be a method using adhesion of a thermosetting resin contained in the resin sheet, or a method using adhesion of a grease applied to the surface of the resin sheet. These methods can be appropriately selected and used depending on needed physical properties, or the configuration of a semiconductor device which is constituted by using a resin sheet laminate.

The resin sheet laminate can be produced by a producing method including a process in which a metal plate or a heat-dissipating plate is disposed at least one surface of the resin sheet to obtain a laminate.

As the method of disposing a metal plate or a heat-dissipating plate on the resin sheet, a commonly used method can be used without particular restriction. Examples thereof include a method in which a metal plate or a heat-dissipating plate is bonded on at least one surface of the resin sheet. Examples of the method of bonding together include a pressing method, and a laminating method. The conditions of the pressing method and the laminating method can be appropriately selected depending on the constitution of the resin sheet.

The resin sheet laminate may have a metal plate or a heat-dissipating plate on one surface of the resin sheet, and an adherend on the other surface. Such a resin sheet laminate is subjected to a thermal treatment to cure the resin sheet, to thereby form a cured resin sheet laminate having an excellent thermal conductivity between the adherend and the metal plate or heat-dissipating plate.

The adherend is not particularly restricted. Examples of the material of the adherend include a metal, a resin, ceramics, and a composite material which is a mixture thereof.

<Method of Producing Cured Resin Sheet Laminate>

A method of producing a cured resin sheet of the present invention is constituted by including a process in which a metal plate or a heat-dissipating plate is disposed on at least one surface of the resin sheet to obtain a resin sheet laminate, and a process in which the resin sheet is heated to cure the resin sheet, which may include other processes as needed.

As the method of disposing a metal plate or a heat-dissipating plate on the resin sheet, a commonly used method can be used without particular restriction. Examples thereof include a method in which a metal plate or a heat-dissipating plate is bonded on at least one surface of the resin sheet. Examples of the method of bonding together include a pressing method and a laminating method. The conditions of the pressing method and the laminating method can be appropriately selected depending on the constitution of the resin sheet.

The method of producing a cured resin sheet laminate preferably includes a pressing process in which, after the process of obtaining a resin sheet laminate, the resin sheet laminate is heated and pressurized so that the third filler is deformed by or followed by a metal plate or a heat-dissipating plate. The pressing process is not particularly restricted as long as at least a part of the third filler can be followed by the adhesive layer interface. Examples thereof include a method of heating and pressurizing by using a pressing device, a laminator, a metal roller pressing device, a vacuum pressing device or the like.

The conditions of heating and pressurizing are, for example, the temperature from 80° C. to 200° C., the pressure from 1 MPa to 100 MPa for from 0.1 min to 360 min; and preferably the temperature from 100° C. to 190° C., the pressure from 2 MPa to 80 MPa for from 0.5 min to 240 min. The heat and pressure treatment can be performed under an atmospheric pressure (under normal pressure), and preferably under reduced pressure. The reduced pressure condition is preferable 30000 Pa or low, and more preferably 10000 Pa or low.

In the method of producing the cured resin sheet laminate, a heat treatment is performed after the process of obtaining a resin sheet laminate to cure the resin sheet. By performing the heat treatment, the thermal conductivity is more improved. The heat treatment can be performed, for example, at from 120° C. to 250° C. for from 10 min to 300 min. From the viewpoint of thermal conductivity, it is preferable that a heat treatment includes a temperature at which a cured resin is likely to form a higher order structure. For example, at least two steps of heating, from 100° C. to 160° C. and from 160° C. to 250° C. are more preferably performed. Further, it is still more preferable that, within the above-mentioned temperature range, a multistep heat treatment having two or more steps is performed.

<Resin Sheet Laminate>

A resin sheet laminate of the present invention is characterized by including a metal plate or a heat-dissipating plate disposed on at least one surface of the resin sheet and the cured resin sheet. Since the resin sheet laminate has such a constitution, the resin sheet laminate has an excellent thermal conductivity and insulation properties. Further, the resin sheet laminate has a good adhesive strength between the cured resin sheet and the metal plate or heat-dissipating plate, and further has excellent thermal impact properties. A method in which a grease or a thermally conductive grease is applied on the surface of the resin sheet and a metal foil or plate is connected thereto may also be used.

<Semiconductor Device>

A semiconductor device of the present invention has a semiconductor element and the cured resin sheet disposed on the semiconductor element. The semiconductor device may further have other members as needed. As the semiconductor element, a commonly used semiconductor element can be used without particular restriction. Specific examples of the semiconductor element include a power semiconductor element such as IGBT or a thyristor and an LED element. Examples of the constitution of a semiconductor device will now be described with reference to the Drawings.

FIGS. 1 to 6 illustrate constitution example of a power semiconductor device constituted by using the cured resin sheet.

FIG. 1 is a schematic cross-sectional view showing a constitution example of a power semiconductor device 100 constituted by laminating a copper plate 104 in which a power semiconductor element 110 is disposed via the solder layer 112, a cured resin sheet 102 of the present invention, and a heat dissipation base 106 disposed on a water-cooling jacket 120 via a grease layer 108. Since the heating element including a power semiconductor element 110 is in contact with a heat dissipation member via the cured resin sheet 102, heat dissipation is effectively performed. The heat dissipation base 106 can be constituted by using copper or aluminum having thermal conductivity. Examples of the power semiconductor element include IGBT and a thyristor.

Figure 2:
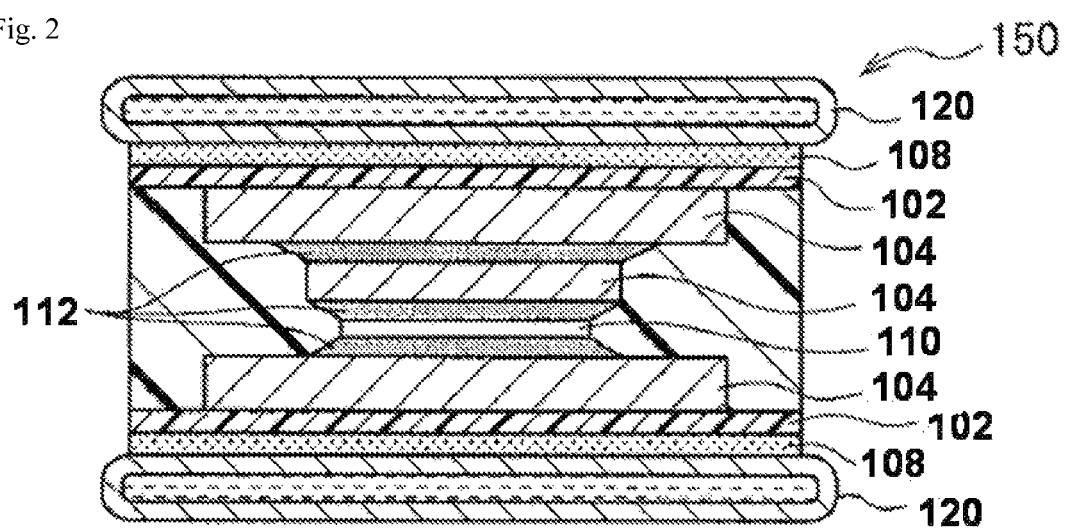
FIG. 2 is a schematic cross-sectional view illustrating one example of the structure of a power semiconductor device constituted by using a resin sheet according to the present invention.

FIG. 2 is a schematic cross-sectional view showing a constitution example of a power semiconductor device 150 constituted by disposing cooling members on both surfaces of the power semiconductor element 110. In the power semiconductor device 150, a cooling member disposed on the upper surface of the power semiconductor element 110 is constituted by including two layers of copper plates 104 via a solder layer 112. By having such a constitution, the occurrence of chip crack or solder crack can be more effectively restricted. In FIG. 2, a copper plate 104 disposed at the farther end from the semiconductor element 110 is connected to a water-cooling jacket 120 via a cured resin sheet 102 and grease layer 108. On the other hand, in a cooling member disposed at the bottom surface of the semiconductor element 110, one layer of copper plate 104 is connected to a water-cooling jacket 120 via the cured resin sheet 102 and grease layer 108. Although, in FIG. 2, the cured resin sheet 102 and the water-cooling jacket 120 are disposed via the grease layer 108, the cured resin sheet 102 and the water-cooling jacket 120 may be disposed such that they are in contact with each other directly.

Figure 3:
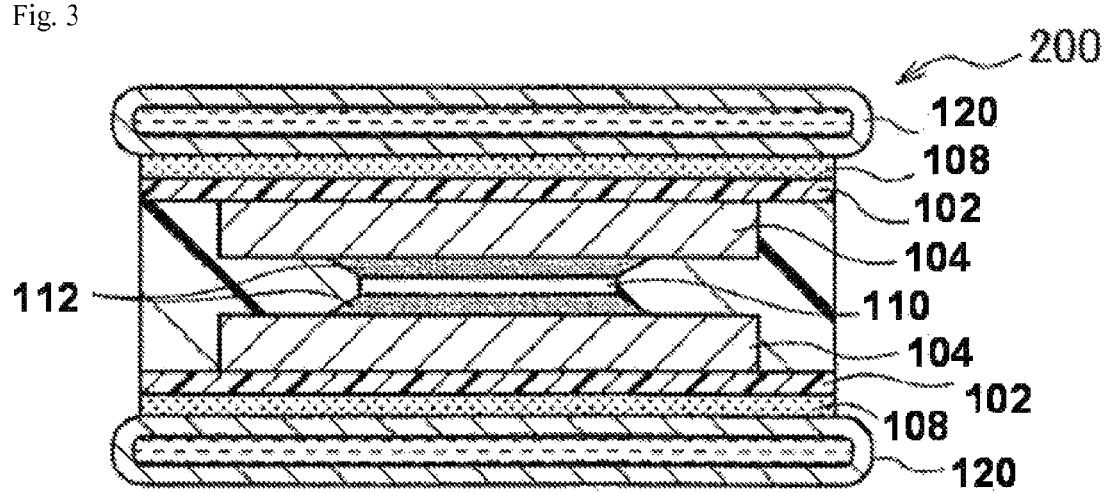
FIG. 3 is a schematic cross-sectional view illustrating one example of the structure of a power semiconductor device constituted by using a resin sheet according to the present invention.

FIG. 3 is a schematic cross-sectional view showing a constitution example of a power semiconductor device 200 constituted by disposing cooling members on both surfaces of a power semiconductor element 110. In the power semiconductor device 200, cooling members disposed on both surfaces of the power semiconductor element 110 are constituted by each including one layer of a copper plate 104. Although, in FIG. 3, a cured resin sheet 102 and a water-cooling jacket 120 are disposed via a grease layer 108, the cured resin sheet 102 and the water-cooling jacket 120 may be disposed such that they are in contact with each other directly.

Figure 4:
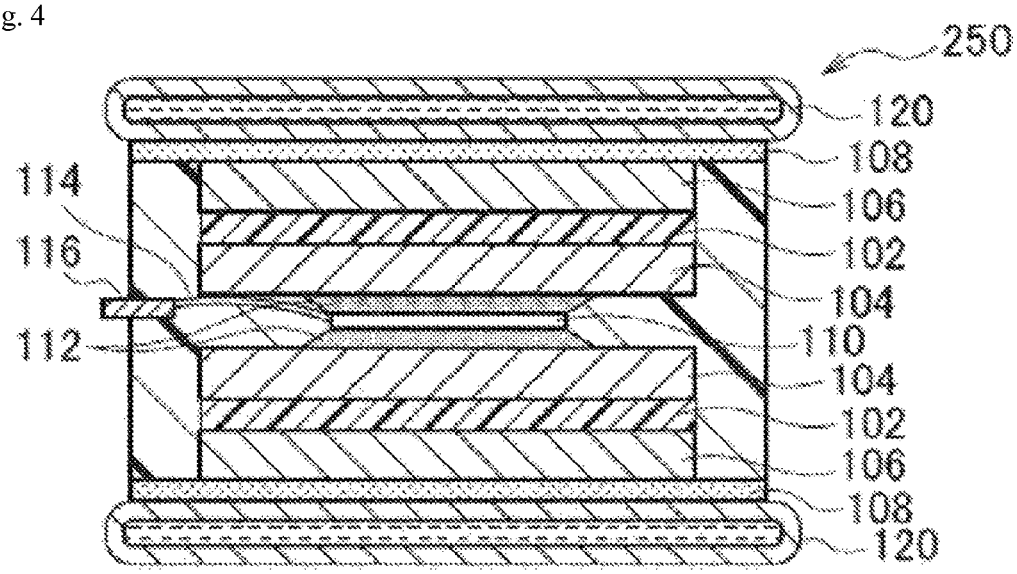
FIG. 4 is a schematic cross-sectional view illustrating one example of the structure of a power semiconductor device constituted by using a resin sheet according to the present invention.

FIG. 4 is a schematic cross-sectional view showing a constitution example of a power semiconductor device 250 constituted by disposing cooling members on both surfaces of a power semiconductor element 110. In the power semiconductor device 250, a cooling member disposed on the upper surface of the power semiconductor element 110 is constituted by including two layers of copper plates 104 laminated via the solder layer 112. By having such a constitution, the occurrence of chip crack or solder crack can be more effectively restricted. By containing a cured resin sheet 102 in a module, an influence by a sheet crack or external vibration can be prevented, which increases reliability. In FIG. 4, a copper plate 104 disposed at the farther end from the semiconductor element 110 is connected to a water-cooling jacket 120 via a cured resin sheet 102, a heat dissipation base 106 and grease layer 108. On the other hand, in a cooling member disposed at the bottom surface of the semiconductor element 110, one layer of the copper plate 104 is connected to a water-cooling jacket 120 via the cured resin sheet 102, a heat dissipation base 106 and a grease layer 108. The power semiconductor element 110 is connected to an external terminal 116 via a wiring member 114. Although, in FIG. 4, the cured resin sheet 102 and the water-cooling jacket 120 are disposed via the heat dissipation base 106 disposed on the cured resin sheet 102 and the grease layer 108, the cured resin sheet 102 and the water-cooling jacket 120 may be disposed such that they are in contact with each other directly.

Figure 5:
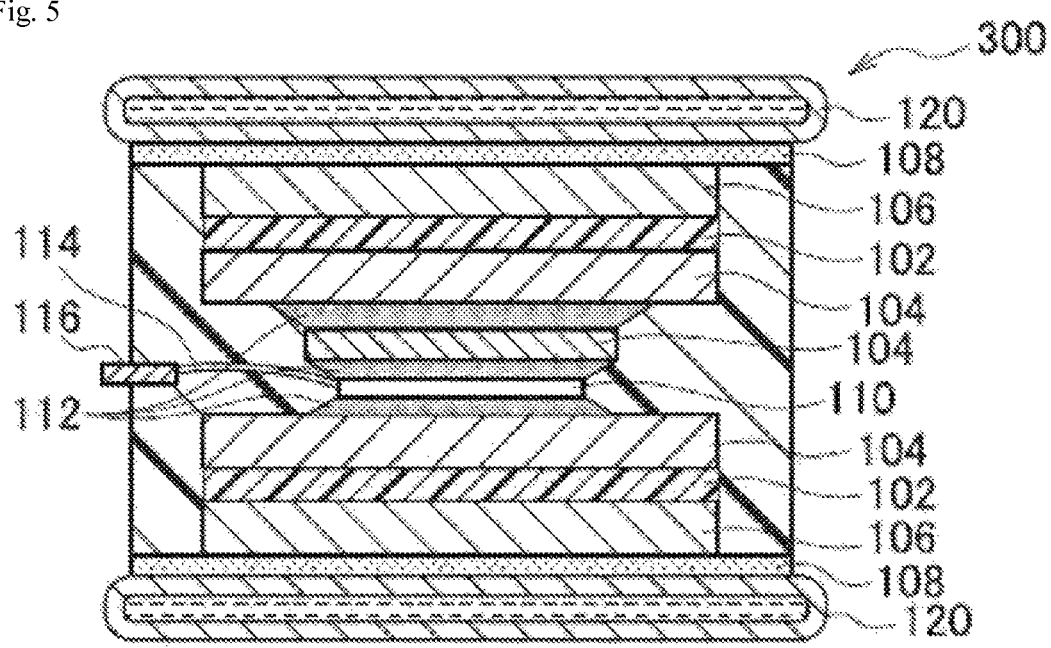
FIG. 5 is a schematic cross-sectional view illustrating one example of the structure of a power semiconductor device constituted by using a resin sheet according to the present invention.

FIG. 5 is a schematic cross-sectional view showing a constitution example of a power semiconductor device 300 constituted by disposing cooling members on both surfaces of a power semiconductor element 110. In the power semiconductor device 300, cooling members disposed on both surfaces of the power semiconductor element 110 is constituted by each including one layer of copper plates 104. By containing a cured resin sheet 102 in a module, an influence by a sheet crack or external vibration can be prevented, which increases reliability. In FIG. 5, a copper plate 104 is connected to a water-cooling jacket 120 via the cured resin sheet 102, a heat dissipation base 106 and a grease layer 108. The power semiconductor element 110 is connected to an external terminal 116 via a wiring member 114. Although, in FIG. 5, the cured resin sheet 102 and the water-cooling jacket 120 are disposed via the heat dissipation base 106 disposed on the cured resin sheet 102 and the grease layer 108, the cured resin sheet 102 and the water-cooling jacket 120 may be disposed such that they are in contact with each other directly.

Figure 6:
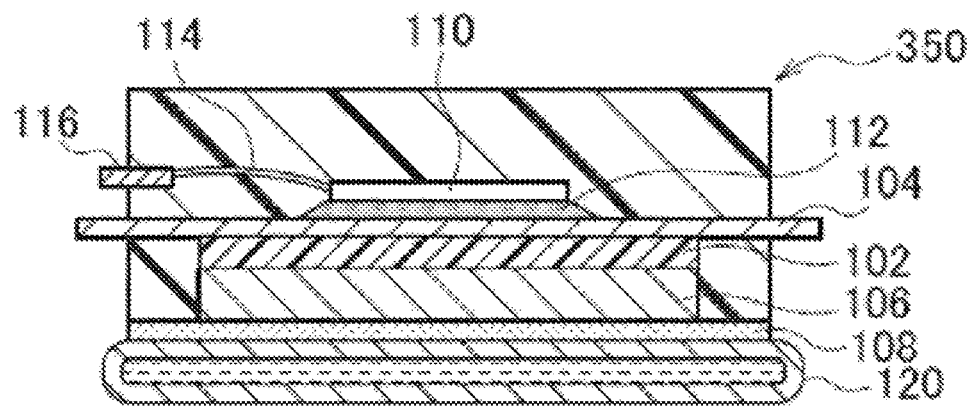
FIG. 6 is a schematic cross-sectional view illustrating one example of the structure of a power semiconductor device constituted by using a resin sheet according to the present invention.

FIG. 6 is a schematic cross-sectional view showing a constitution example of a power semiconductor device 350 constituted by laminating a copper plate 104 in which a power semiconductor element 110 is disposed via the solder layer 112, a cured resin sheet 102, and a heat dissipation base 106 disposed on a water-cooling jacket 120 via a grease layer 108. Since the heating element including a power semiconductor element 110 is in contact with a heat dissipation member via the cured resin sheet 102, heat dissipation is effectively performed. The heat dissipation base 106 can be constituted by using copper or aluminum having thermal conductivity.

<LED Device>

A LED device of the present invention is constituted in which an LED element, the cured resin sheet according to Claim 10 and a substrate are laminated in this order. The LED device may further include other members as needed. Examples of the substrate include an aluminum substrate.

FIGS. 7 to 10 show a constitution example of an LED device constituted by using a cured resin sheet of the present invention.

Figure 7:
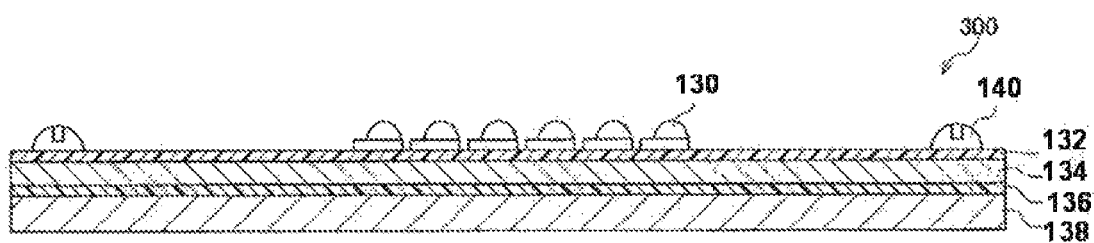
FIG. 7 is a schematic cross-sectional view illustrating one example of the structure of an LED light bar constituted by using a resin sheet according to the present invention.

FIG. 7 is a schematic cross-sectional view illustrating one example of the structure of an LED light bar 300 constituted by using a cured resin sheet of the present invention. The LED light bar 300 is constituted by disposing a housing 138, a grease layer 136, an aluminum substrate 134, a cured resin sheet 132, and an LED chip 130 in this order and fixing them by a screw 140. The LED chip 130 which is a heating element is disposed on the aluminum substrate 134 via the cured resin sheet 132, whereby heat dissipation can efficiently be performed.

Figure 8:
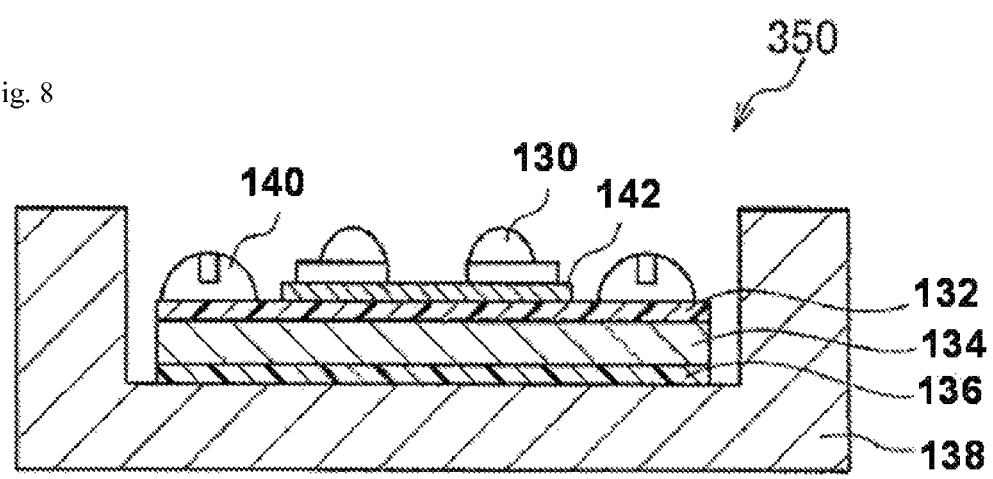
FIG. 8 is a schematic cross-sectional view illustrating one example of the structure of an LED light bulb constituted by using a resin sheet according to the present invention.
Figure 9:
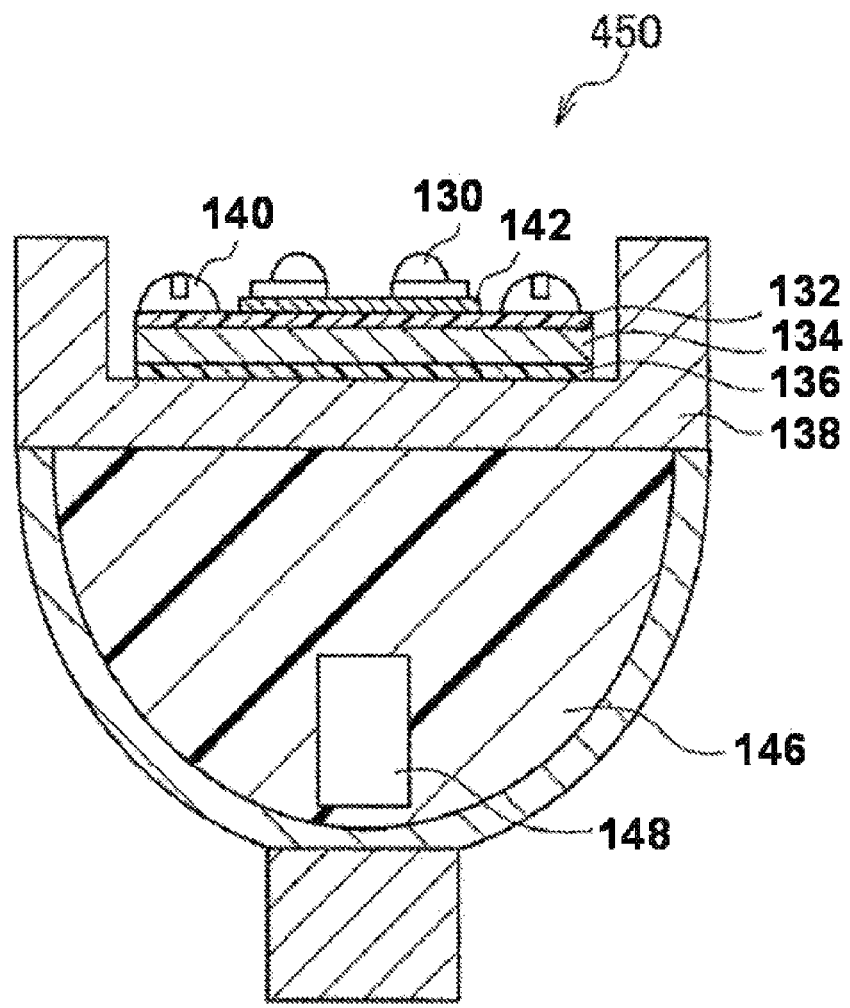
FIG. 9 is a schematic cross-sectional view illustrating one example of the structure of an LED light bulb constituted by using a resin sheet according to the present invention.
Figure 10:
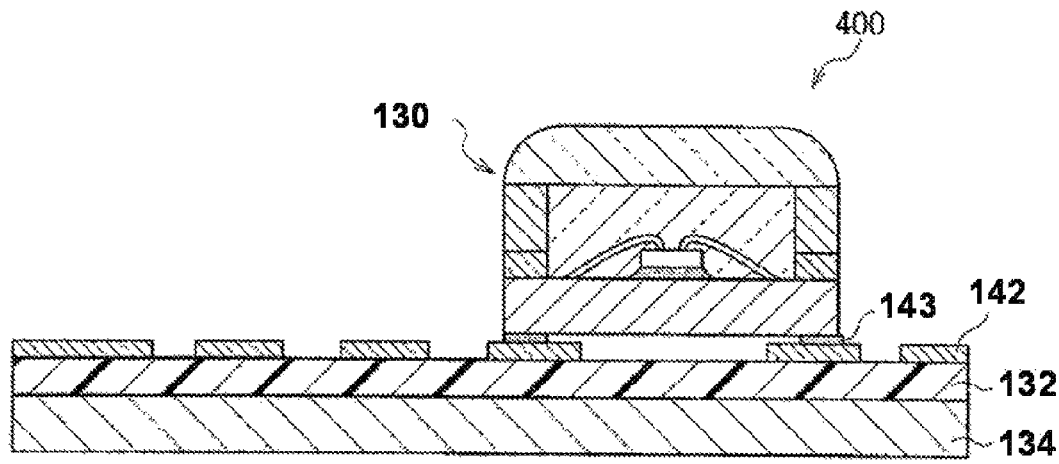
FIG. 10 is a schematic cross-sectional view illustrating one example of the structure of an LED substrate constituted by using a resin sheet according to the present invention.

FIG. 8 is a schematic cross-sectional view showing a constitution example of a light emitting portion 350 of an LED light bulb. The light emitting portion 350 of an LED light bulb is constituted by disposing a housing 138, a grease layer 136, an aluminum substrate 134, a cured resin sheet 132, a circuit layer 142, and an LED chip 130 in this order and fixing them by a screw 140. FIG. 9 is a schematic cross-sectional view illustrating one example of the structure of the whole LED light bulb 450. A housing 138 of an LED light bulb is disposed on a sealing resin 146 containing a power source member 148.

FIG. 9 is a schematic cross-sectional view illustrating one example of the structure of an LED substrate 400. The LED substrate 400 is constituted by disposing an aluminum substrate 134, a cured resin sheet 132 of the present invention, a circuit layer 142, and an LED chip 130 in this order. The LED chip 130 which is a heating element is disposed on the aluminum substrate 134 via the circuit layer 142 and the cured resin sheet 132, whereby heat dissipation is efficiently performed.

EXAMPLES

The present invention will be described more specifically below by way of examples, provided that the present invention be not limited thereto. The expressions "part" and "%" herein are by mass, unless otherwise specified.

In the following, materials used for producing a resin sheet and the abbreviations thereof are listed.

(Filler)

AA-18: aluminum oxide, product name: AA-18 manufactured by Sumitomo Chemical Company, Limited, volume-average particle size 18 μm AA-3: aluminum oxide, product name: AA-3, manufactured by Sumitomo Chemical Company, Limited, volume-average particle size 3 μm AA-04: aluminum oxide, product name: AA-04, manufactured by Sumitomo Chemical Company, Limited, volume-average particle size 0.4 μm FS-3: boron nitride, product name: FS-3, manufactured by MIZUSHIMA FERROALLOY CO., LTD., volume-average particle size 76 μm HP-40: boron nitride, product name: HP40MF100, manufactured by MIZUSHIMA FERROALLOY CO., LTD., volume-average particle size 45 μm (Novolac Resin)

CRN: catechol resorcinol novolac resin (containing 50% of cyclohexanone (CHN)), the below-mentioned synthetic product PN: phenol novolac resin, manufactured by Hitachi Chemical Co., Ltd., model HP850N, number average molecular weight 630

CPN: cresol novolac resin, manufactured by Nippon Kayaku Co., Ltd.

TPM: triphenylmethane novolac resin, manufactured by Nippon Kayaku Co., Ltd.

(Epoxy Resin Monomer)

PNAP: triphenylmethane epoxy resin, product name: EPPN-502H, manufactured by Nippon Kayaku Co., Ltd.

MOPOC: 1-{(3-methyl-4-oxiranyl methoxy)phenyl}-4-(4-oxiranyl methoxy phenyl)-1-cyclohexene, synthetic product MOPOC was prepared with reference to JP-A-2005-206814, JP-A-2005-29778 or the like.

Bis-A/D: bisphenol AD mixture, model ZX-1059, manufactured by Nippon Steel Chemical Co., Ltd.

(Additives)

TPP: triphenylphosphine (curing catalyst, manufactured by Wako Pure Chemical Industries, Ltd.)

PAM: 3-phenyl aminopropyltrimethoxysilane (silane coupling agent, product name: KBM-573, manufactured by Shin-Etsu Chemical Co., Ltd.)

(Solvent)

MEK: methyl ethyl ketone (manufactured by Wako Pure Chemical Industries, Ltd., first grade)

CHN: cyclohexanone (manufactured by Wako Pure Chemical Industries, Ltd., first grade)

(Support)

PET film: product name: 75E-0010CTR-4, manufactured by FUJIMORI KOGYO CO., LTD.

copper foil: product name GTS 080, manufactured by Furukawa Electric Co., Ltd., thickness 80 μm aluminum foil: manufactured by Sumitomo Light Metal Industries, Ltd., thickness 20 μm (Synthesis of Novolac Resin)

Synthesis Example 1

Under nitrogen atmosphere, into a separable flask, 105 g of resorcinol and 5 g of catechol as monomers of a phenol compound, 0.11 g of oxalic acid (0.1%, ratio with respect to monomer) as a catalyst, 15 g of methanol as a solvent were weighed and put, and then, the content was stirred, followed by adding thereto 30 g of formalin while cooling to 40° C. or lower in an oil bath. The mixture was stirred for two hours, and then, the temperature of the oil bath was set to 100° C., and water and methanol was removed by evaporation under reduced pressure. After confirming that water and methanol were not distilled, CHN was added thereto such that the content of the novolac resin was 50%, thereby obtaining a catechol resorcinol novolac resin solution (CRN1). Further, by changing the amount of formalin to be added without changing the amounts of resorcinol and catechol to be added, CRN2 to CRN5 in total five types were produced as CRNs having different monomer content ratios and different number average molecular weight.

The number average molecular weight, monomer content ratio of the obtained products were determined by molecular weight measurement by GPC. The NMR spectra of the obtained products were measured to confirm that a structural unit represented by the general Formula (I) is contained. The conditions of GPC measurement and NMR measurement is mentioned below.

TABLE 1

|      | Monomer Content Ratio (%) | Number Average Molecular Weight (g/mol) |
|------|---------------------------|------------------------------------------|
| CRN1 | 5                         | 733                                      |
| CRN2 | 20                        | 554                                      |
| CRN3 | 27                        | 484                                      |
| CRN4 | 38                        | 425                                      |
| CRN5 | 50                        | 306                                      |

Example 1

Preparation of Resin Sheet

Aluminum oxide mixture (AA-3:AA-04; volume mixing ratio based on volume, 2.4:1) 42.91 parts, boron nitride (HP-40) 46.04 parts (volume mixing ratio based on volume with respect to AA-04, 6.6), silane coupling agent (PAM) 0.09 parts, CHN solution of CRN4 as an epoxy resin curing agent 7.23 parts (solid content 50%), CHN 46.02 parts were mixed. After confirming the uniformity of the mixture, MOPOC 11.73 parts as epoxy resin monomers and TPP 0.13 parts were further added thereto, and then, ball milling was performed for 20 hours to 40 hours, thereby obtaining a coating liquid for forming a resin layer as a resin composition. The filler content with respect to the whole solid volume of the resin composition was 60% by volume.

Using a PET (polyethylene terephthalate) film (thickness 50 μm, manufactured by Teijin DuPont Films Japan Limited, A31; hereinafter, also referred to as "PET film") having one surface of which was subjected to a mold release treatment as a support, the obtained coating liquid for forming a resin layer was applied using a comma coater (manufactured by HIRANO TECSEED Co., Ltd.) on the mold release treatment surface such that the thickness was about 140 μm to form a coating layer. The coating layer was dried in a box-type oven at 100° C. for five minutes, to form a resin sheet in which a resin layer in an A stage state was formed on a PET film (hereinafter, also referred to as "A stage sheet") was formed.

By using two sheets of the A stage sheets obtained in the above, they were overlapped with each other such that the resin layers were opposed to each other. By using heat pressing device (heat plate 150° C., pressure 10 MPa, treatment time 1 min.), the layers were bonded with each other by a heat and pressure treatment, thereby obtaining a resin sheet in a B stage state having an average thickness of 198 μm (hereinafter, also referred to as "B stage sheet").

(Producing of Cured Resin Sheet Laminate)

PET films were peeled from both surfaces of the B stage sheet obtained in the above, and on both surfaces of the B stage sheet, copper foils having a thickness of 80 μm (manufactured by Furukawa Electric Co., Ltd., thickness 80 μm, GTS grade) were overlapped respectively, followed by a pressing treatment (pressing treatment condition: heat plate temperature 165° C., degree of vacuum ≤1 kPa, pressure 10 MPa, treatment time 3 min). Further, in a box-type oven, a heat treatment was performed at 140° C. for two hours, at 165° C. for two hours, and at 190° C. for two hours, successively, to obtain a cured resin sheet laminate 1 in a C stage state in which copper foils were provided on both surface thereof.

Example 2

In a similar manner to Example 1 except that in place of HP-40, a mixture of FS-3 and HP-40 (1:3 based on volume) was used in Example 1, a resin sheet in an A stage state, a resin sheet in an B stage state, and a cured resin sheet laminate 2 in a C stage state on both surfaces of which copper foils were provided were individually obtained.

Example 3

In a similar manner to Example 1 except that in place of HP-40, a mixture of FS-3 and HP-40 (1:1 based on volume) was used in Example 1, a resin sheet in an A stage state, a resin sheet in an B stage state, and a cured resin sheet laminate 3 in a C stage state on both surfaces of which copper foils were provided were individually obtained.

Example 4

In a similar manner to Example 1 except that in place of MOPOC, Bis-A/D: 11.15 parts, CRN4: 8.38 parts were used in Example 1, a resin sheet in an A stage state, a resin sheet in an B stage state, and a cured resin sheet laminate 4 in a C stage state on both surfaces of which copper foils were provided were individually obtained.

Example 5

In a similar manner to Example 1 except that in place of MOPOC, a mixture of Bis-A/D: 5.6 parts and PNAP: 5.6 parts was used and CRN4: 8.27 parts was used in Example 1, a resin sheet in an A stage state, a resin sheet in an B stage state, and a cured resin sheet laminate 5 in a C stage state on both surfaces of which copper foils were provided were individually obtained.

Example 6

The coating liquid for forming a resin layer obtained in Example 5 was applied on an aluminum foil having a thickness of 20 μm by using a comma coater such that the thickness was about 140 μm to form a coating layer. The coating layer was dried in a box-type oven at 100° C. for five minutes, to form a resin sheet in which a resin layer in an A stage state was formed on an aluminum foil having a thickness of 20 μm (hereinafter, also referred to as "A stage sheet") was formed. The coating liquid for forming a resin layer was applied on a PET film such that the thickness was about 140 μm, and dried in a box-type oven at 100° C. for five minutes, to form a resin sheet in an A stage state on a PET film.

By using one A stage sheet in which a resin layer is formed on the aluminum foil obtained in the above and one A stage sheet in which a resin layer is formed on the PET film obtained in Example 1, they were overlapped with each other such that the resin layers were opposed to each other. By using heat pressing device (heat plate 150° C., pressure 10 MPa, treatment time 1 min.), the layers were bonded with each other by a heat and pressure treatment, thereby obtaining a resin layer sheet in a B stage state (B stage sheet) having an average thickness of 192 μm.

(Producing of Cured Resin Sheet Laminate)

A PET film was peeled from one surface of the B stage sheet obtained in the above, and on the surface of the B stage sheet where the PET film was peeled, copper foils having a thickness of 80 μm (manufactured by Furukawa Electric Co., Ltd., thickness 80 μm, GTS grade) were overlapped, followed by a pressing treatment (pressing process condition: heat plate temperature 165° C., degree of vacuum ≤1 kPa, pressure 10 MPa, treatment time 3 min.). In a box-type oven, a heat treatment was performed at 140° C. for two hours, at 165° C.

for two hours, and at 190° C. for two hours, successively, to obtain a cured resin sheet laminate 6 in a C stage state on one surface of which a copper foil was provided and on another surface of which an aluminum foil is provided.

Example 7

In a similar manner as in Example 6 except that the coating liquid for forming a resin layer obtained in Example 5 was applied on an aluminum foil having a thickness of 20 μm by using a comma coater such that the thickness was about 110 μm, and was applied on a PET film such that the thickness was about 170 μm, a cured resin sheet laminate 7 in a C stage state on one surface of which a copper foil was provided, and on another surface of which an aluminum foil was provided was obtained.

Example 8

In a similar manner to Example 5 except that in place of CRN4, CRN1 was used in Example 5, a resin sheet in an A stage state, a resin sheet in an B stage state, and a cured resin sheet laminate 8 in a C stage state on both surfaces of which copper foils were provided were individually obtained.

Example 9

In a similar manner to Example 5 except that in place of CRN4, CRN2 was used in Example 5, a resin sheet in an A stage state, a resin sheet in an B stage state, and a cured resin sheet laminate 9 in a C stage state on both surfaces of which copper foils were provided were individually obtained.

Example 10

In a similar manner to Example 5 except that in place of CRN4, CRN3 was used in Example 5, a resin sheet in an A stage state, a resin sheet in an B stage state, and a cured resin sheet laminate 10 in a C stage state on both surfaces of which copper foils were provided were individually obtained.

Example 11

In a similar manner to Example 5 except that in place of CRN4, CRN5 was used in Example 5, a resin sheet in an A stage state, a resin sheet in an B stage state, and a cured resin sheet laminate 11 in a C stage state on both surfaces of which copper foils were provided were individually obtained.

Example 12

(Preparation of Resin Sheet)
Aluminum oxide mixture (AA-3:AA-04; volume mixing ratio based on volume, 1:1) 25.24 parts, boron nitride (HP-40) 55.81 parts (volume mixing ratio based on volume with respect to AA-04, 8.0), silane coupling agent (PAM) 0.08 parts, CHN solution of CRN4 as an epoxy resin curing agent 13.5 parts (solid content 50%), CHN 38.8 parts were mixed. After confirming the uniformity of the mixture, PNAP 9.17 parts, BIS-A/D 9.17 parts as epoxy resin monomers, and TPP 0.20 parts were further added thereto, and then, ball milling was performed for 20 hours to 40 hours, thereby obtaining a coating liquid for forming a resin layer as a resin composition. The filler content with respect to the whole solid volume of the resin composition was 60% by volume.

The obtained coating liquid for forming a resin layer was applied using a comma coater and using a PET film having one surface of which was subjected to a mold release treatment as a support such that the thickness on the mold release treatment surface was about 140 μm to form a coating layer. The coating layer was dried in a box-type oven at 100° C. for five minutes, to form a resin sheet in which a resin layer in an A stage state was formed on a PET film was formed.

By using two sheets of the A stage sheets obtained in the above, they were overlapped with each other such that the resin layers were opposed to each other. By using heat pressing device (heat plate 150° C., pressure 10 MPa, treatment time 1 min.), the layers were bonded with each other by a heat and pressure treatment, thereby obtaining a resin sheet in a B stage state having an average thickness of 209 μm.

(Producing of Cured Resin Sheet Laminate)
PET films were peeled from both surfaces of the B stage sheet obtained in the above, and on both surfaces of the B stage sheet, copper foils having a thickness of 80 μm (manufactured by Furukawa Electric Co., Ltd., thickness 80 μm, GTS grade) were overlapped respectively, followed by a pressing treatment (pressing treatment condition: heat plate temperature 165° C., degree of vacuum ≤1 kPa, pressure 10 MPa, treatment time 3 min). Further, in a box-type oven, a heat treatment was performed at 140° C. for two hours, at 165° C. for two hours, and at 190° C. for two hours, successively, to obtain a cured resin sheet laminate 12 in a C stage state on both surface of which copper foils were provided.

Example 13

The coating liquid for forming a resin layer obtained in Example 12 was applied on a copper foil having a thickness of 80 μm by using a comma coater such that the thickness was about 140 μm to form a coating layer. The coating layer was dried in a box-type oven at 100° C. for five minutes, to form a resin sheet in which a resin layer in an A stage state was formed on an copper foil (hereinafter, also referred to as "A stage sheet"). The coating liquid for forming a resin layer was applied on a mold release surface on a PET film such that the thickness was about 140 μm, and dried in a box-type oven at 100° C. for five minutes, to form a resin sheet in an A stage state on a PET film.

By using one A stage sheet in which a resin layer is formed on the copper foil obtained in the above and one A stage sheet in which a resin layer is formed on the PET film, they were overlapped with each other such that the resin layers were opposed to each other. By using heat pressing device (heat plate 150° C., pressure 10 MPa, treatment time 1 min.), the layers were bonded with each other by a heat and pressure treatment, thereby obtaining a resin layer sheet in a B stage state (B stage sheet) having an average thickness of 211 μm.

(Producing of Cured Resin Sheet Laminate)
A PET film was peeled from one surface of the B stage sheet obtained in the above, and on the surface of the B stage sheet where the PET film was peeled, copper foils having a thickness of 80 μm (manufactured by Furukawa Electric Co., Ltd., thickness 80 μm, GTS grade) were overlapped, followed by a pressing treatment (pressing process condition: heat plate temperature 165° C., degree of vacuum ≤1 kPa, pressure 10 MPa, treatment time 3 min). In a box-type oven, a heat treatment was performed at 140° C. for two hours, at 165° C. for two hours, and at 190° C. for two hours, successively, to obtain a cured resin sheet laminate 13 in a C stage state on one surface of which a copper foil was provided and on another surface of which an copper foil is provided.

Example 14

The coating liquid for forming a resin layer obtained in Example 12 was applied on an aluminum foil having a thickness of 80 μm by using a comma coater such that the thickness was about 140 μm to form a coating layer. The coating layer was dried in a box-type oven at 100° C. for five minutes, to form a resin sheet in which a resin layer in an A stage state was formed on an aluminum foil (hereinafter, also referred to as "A stage sheet"). The coating liquid for forming a resin layer was applied on a mold release surface on a PET film such that the thickness was about 140 μm, and dried in a box-type oven at 100° C. for five minutes, to form a resin sheet in an A stage state on a PET film.

By using one A stage sheet in which a resin layer is formed on the aluminum foil obtained in the above and one A stage sheet in which a resin layer is formed on the PET film, they were overlapped with each other such that the resin layers were opposed to each other. By using heat pressing device (heat plate 150° C., pressure 10 MPa, treatment time 1 min.), the layers were bonded with each other by a heat and pressure treatment, thereby obtaining a resin layer sheet in a B stage state (B stage sheet) having an average thickness of 211 μm.

(Producing of Cured Resin Sheet Laminate)

A PET film was peeled from one surface of the B stage sheet obtained in the above, and on the surface of the B stage sheet where the PET film was peeled, copper foils having a thickness of 80 μm (manufactured by Furukawa Electric Co., Ltd., thickness 80 μm, GTS grade) were overlapped, followed by a pressing treatment (pressing process condition: heat plate temperature 165° C., degree of vacuum ≤1 kPa, pressure 10 MPa, treatment time 3 min.). In a box-type oven, a heat treatment was performed at 140° C. for two hours, at 165° C. for two hours, and at 190° C. for two hours, successively, to obtain a cured resin sheet laminate 14 in a C stage state on one surface of which a copper foil was provided and on another surface of which an aluminum foil is provided.

Example 15

Preparation of Resin Sheet

Aluminum oxide mixture (AA-3:AA-04; volume mixing ratio based on volume, 1:1) 25.24 parts, boron nitride (HP-40) 55.81 parts (volume mixing ratio based on volume with respect to AA-04, 8.0), silane coupling agent (PAM) 0.08 parts, CHN solution of CRN4 as an epoxy resin curing agent 9.78 parts (solid content 50%), CHN 34.8 parts were mixed. After confirming the uniformity of the mixture, PNAP 6.62 parts and BIS-A/D 6.62 parts as epoxy resin monomers, and TPP 0.15 parts were further added thereto, and then, ball milling was performed for 20 hours to 40 hours, thereby obtaining a coating liquid for forming a resin layer as a resin composition. The filler content with respect to the whole solid volume of the resin composition was 68% by volume.

The obtained coating liquid for forming a resin layer was applied using a comma coater and using a PET film one surface of which was subjected to a mold release treatment as a support such that the thickness on the mold release treatment surface was about 140 μm to form a coating layer. The coating layer was dried in a box-type oven at 100° C. for five minutes, to form a resin sheet in which a resin layer in an A stage state was formed on a PET film was formed.

By using two sheets of the A stage sheets obtained in the above, they were overlapped with each other such that the resin layers were opposed to each other. By using heat pressing device (heat plate 150° C., pressure 10 MPa, treatment time 1 min), the layers were bonded with each other by a heat and pressure treatment, thereby obtaining a resin sheet in a B stage state having an average thickness of 209 μm.

(Producing of Cured Resin Sheet Laminate)

PET films were peeled from both surfaces of the B stage sheet obtained in the above, and on both surfaces of the B stage sheet, copper foils having a thickness of 80 μm (manufactured by Furukawa Electric Co., Ltd., thickness 80 μm, GTS grade) were overlapped respectively, followed by a pressing treatment (pressing treatment condition: heat plate temperature 165° C., degree of vacuum ≤1 kPa, pressure 10 MPa, treatment time 3 min.). Further, in a box-type oven, a heat treatment was performed at 140° C. for two hours, at 165° C. for two hours, and at 190° C. for two hours, successively, to obtain a cured resin sheet laminate 15 in a C stage state on both surface of which copper foils were provided.

Example 16

Producing of Cured Resin Sheet Laminate

In a similar manner to Example 13 except that, in Example 13, a coating liquid for forming a resin layer produced in Example 15 was used as a coating liquid for forming a resin layer, a resin sheet in an A stage state, a resin sheet in a B stage state and a cured resin sheet laminate 16 in a C stage state both surfaces of which copper foils were provided were individually obtained.

Example 17

Producing of Cured Resin Sheet Laminate

In a similar manner to Example 14 except that, in Example 14, a coating liquid for forming a resin layer produced in Example 15 was used as a coating liquid for forming a resin layer, a resin sheet in an A stage state, a resin sheet in a B stage state and a cured resin sheet laminate 17 in a C stage state one surface of which a copper foil was provided and another surface of which an aluminum foil was provided were individually obtained.

Example 18

Preparation of Resin Sheet

Aluminum oxide mixture (AA-3:AA-04; volume mixing ratio based on volume, 1:1) 25.24 parts, boron nitride (HP-40) 55.81 parts (volume mixing ratio based on volume with respect to AA-04, 8.0), silane coupling agent (PAM) 0.08 parts, CHN solution of CRN4 as an epoxy resin curing agent 6.41 parts (solid content 50%), CHN 32.4 parts were mixed. After confirming the uniformity of the mixture, PNAP 4.34 parts and BIS-A/D 4.34 parts as epoxy resin monomers, and TPP 0.10 parts were further added thereto, and then, ball milling was performed for 20 hours to 40 hours, thereby obtaining a coating liquid for forming a resin layer as a resin composition. The filler content with respect to the whole solid volume of the resin composition was 76% by volume.

The obtained coating liquid for forming a resin layer was applied using a comma coater and using a PET film one surface of which was subjected to a mold release treatment as a support such that the thickness on the mold release treatment surface was about 140 μm to form a coating layer. The coating layer was dried in a box-type oven at 100° C. for five minutes, to form a resin sheet in which a resin layer in an A stage state was formed on a PET film was formed.

By using two sheets of the A stage sheets obtained in the above, they were overlapped with each other such that the resin layers were opposed to each other. By using heat pressing device (heat plate 150° C., pressure 10 MPa, treatment time 1 min.), the layers were bonded with each other by a heat and pressure treatment, thereby obtaining a resin sheet in a B stage state having an average thickness of 206 μm.

(Producing of Cured Resin Sheet Laminate)

PET films were peeled from both surfaces of the B stage sheet obtained in the above, and on both surfaces of the B stage sheet, copper foils having a thickness of 80 μm (manufactured by Furukawa Electric Co., Ltd., thickness 80 μm, GTS grade) were overlapped respectively, followed by a pressing treatment (pressing treatment condition: heat plate temperature 165° C., degree of vacuum ≤1 kPa, pressure 10 MPa, treatment time 3 min). Further, in a box-type oven, a heat treatment was performed at 140° C. for two hours, at 165° C. for two hours, and at 190° C. for two hours, successively, to obtain a cured resin sheet laminate 18 in a C stage state on both surface of which copper foils were provided.

Example 19

Producing of Cured Resin Sheet Laminate

In a similar manner to Example 13 except that, in Example 13, a coating liquid for forming a resin layer produced in Example 18 was used as a coating liquid for forming a resin layer, a resin sheet in an A stage state, a resin sheet in a B stage state and a cured resin sheet laminate 19 in a C stage state both surfaces of which copper foils were provided were individually obtained.

Example 20

Producing of Cured Resin Sheet Laminate

In a similar manner to Example 14 except that, in Example 14, a coating liquid for forming a resin layer produced in Example 18 was used as a coating liquid for forming a resin layer, a resin sheet in an A stage state, a resin sheet in a B stage state and a cured resin sheet laminate 20 in a C stage state one surface of which a copper foil was provided and another surface of which an aluminum foil was provided were individually obtained.

Comparative Example 1

Preparation of Resin Sheet

Aluminum oxide mixture (AA-18:AA-3: AA-04; volume mixing ratio based on volume, 6.6:2.4:1) 83.29 parts, silane coupling agent (PAM; KBM-573) 0.13 parts, CHN solution of CRN4 as an epoxy resin curing agent 11.96 parts (solid content 50%), MEK 44.77 parts, and CHN 9.29 parts were mixed. After confirming the uniformity of the mixture, MOPOC as epoxy resin monomers 19.39 parts, TPP 0.20 parts were further added thereto, and then, ball milling was performed for 20 hours to 40 hours, thereby obtaining a coating liquid for forming a thermally conductive layer as a resin composition.

The obtained coating liquid for forming a thermally conductive layer was applied using a comma coater (manufactured by HIRANO TECSEED Co., Ltd.) on a mold release surface of a PET film to form a coating layer such that the thickness of the coating layer was about 150 μm. The coating layer was dried in a box-type oven at 100° C. for 15 minutes, to form a resin layer on a PET film, thereby obtaining a resin sheet in an A stage state (A stage sheet). By using two sheets of the A stage sheets obtained in the above, they were overlapped with each other such that the resin layers were opposed to each other. By using a laminator, the layers were bonded with each other in conditions of temperature 130° C., pressure 1 MPa, degree of vacuum ≤1 kPa, time 15 seconds, and then, a PET film was peeled, thereby obtaining a resin sheet in a B stage state having an average thickness of 198 μm (B stage sheet).

(Producing of Cured Resin Sheet Laminate)

PET films were peeled from both surfaces of the B stage sheet obtained in the above, and on the surface of the B stage sheet where the PET film was peeled, copper foils having a thickness of 80 μm (manufactured by Furukawa Electric Co., Ltd., thickness 80 μm, GTS grade) were overlapped, followed by a pressing treatment (pressing process condition: heat plate temperature 165° C., degree of vacuum ≤1 kPa, pressure 10 MPa, treatment time 3 min.). Thereafter, in a box-type oven, a heat treatment was performed at 140° C. for two hours, at 165° C. for two hours, and at 190° C. for two hours, successively, to obtain a cured resin sheet laminate C1 in a C stage state on both surfaces of which copper foils were provided.

Comparative Example 2

In a similar manner to Example 1 except that Bis-A/D 11.09 parts instead of MOPOC and PN 7.83 parts instead of CRN4 were used in Example 1, a resin sheet in an A stage state, a resin sheet in an B stage state, and a cured resin sheet laminate C2 in a C stage state on both surfaces of which copper foils were provided were individually obtained.

Comparative Example 3

In a similar manner to Example 1 except that, Bis-A/D 10.54 parts instead of MOPOC, and CPN 8.37 parts instead of CRN4 were used in Example 1, a resin sheet in an A stage state, a resin sheet in an B stage state, and a cured resin sheet laminate C3 in a C stage state on both surfaces of which copper foils were provided were individually obtained.

Comparative Example 4

In a similar manner to Example 1 except that Bis-A/D 13.68 parts instead of MOPOC, and CPN 5.23 parts instead of CRN4 were used in Example 1, a resin sheet in an A stage state, a resin sheet in an B stage state, and a cured resin sheet laminate C4 in a C stage state on both surfaces of which copper foils were provided were individually obtained.

<Evaluation>

For a resin sheet in an A stage state, a resin sheet in a B stage state and a cured resin sheet laminate in a C stage state obtained in the above, the following evaluations were performed. The evaluation results are listed on Tables 2 to 5. In Tables 2 to 5, the unit for values of the resin compositions is parts by mass, and "-" represents "not mixed".

(GPC Measurement)

In the above synthesis Examples, the obtained CRNs were dissolved in tetrahydrofuran (for liquid chromatograph), and, an insoluble matter was removed through a PTFE filter (manufactured by KURABO INDUSTRIES LTD., for pretreatment for HPLC, chromato disc, model: 13N, pore size: 0.45 μm). GPC (pump: L6200 Pump (manufactured by Hitachi, Ltd.); detector: differential refractive index detector L3300 RI Monitor (manufactured by Hitachi, Ltd.); column: TSKgel-G5000HXL and TSKgel-G2000HXL (two in total) (both manufactured by Tosoh Corporation) are connected in series; column temperature: 30° C.; eluent: tetrahydrofuran;

current: 1.0 ml/min.; standard substance: polystyrene) was used and number average molecular weight was determined by molecular weight measurement. At the same time, the content ratio of monomer contained in CRN was measured.

(NMR Measurement)

The CRN obtained in the synthesis Example above, was dissolved in deuterated dimethyl sulfoxide (DMSO-$d_6$). By using a proton nuclear magnetic resonance method ($^1$H-NMR) (AV-300(300 MHz) manufactured by Bruker Corporation, $^1$H-NMR spectrum was measured. For the standard of a chemical shift, tetramethylsilane which is an internal standard material was set to 0 ppm.

(Thermal Conductivity of Cured Resin Sheet)

From a cured resin sheet laminate in a C stage state obtained in the above, a copper foil was etched away by using a sodium persulfate solution. Further, for a sample which includes an aluminum foil, an aluminum foil was etched away by using a hydrochloric solution. By the above processes, a cured resin sheet was obtained. This was cut into 10 mm square blocks; the blocks were subjected to a blackening treatment by graphite spraying; and the thermal diffusivity was measured by using a Nanoflash LFA447 manufactured by NETZSCH.

The measurement conditions were as follows: the measurement temperature 25±1° C., measurement voltage 270 V, Amplitude 5000, and pulse width 0.06 ms.

In the above, the thermal conductivity was calculated by the product of the measured thermal diffusivity, the density measured by an Archimedian method, and the specific heat measured by DSC (differential calorimeter).

(Insulation Breakdown Voltage of B Stage Sheet)

A B stage sheet was sandwiched by a 20 mmΦ aluminum electrode and a 50 mm square aluminum plate, and the insulation breakdown voltage thereof under alternating current was measured by using YST-243-100RHO manufactured by YAMAYO MEASURING TOOLS CO., LTD. Measurement was performed under the conditions: pressure increase speed 1 kV/sec., measurement temperature: 23° C.±2° C., and under the air.

(Insulation Breakdown Voltage of Cured Resin Sheet)

From a cured resin sheet laminate in a C stage state obtained in the above, a copper foil was etched away by using a sodium persulfate solution. Further, for a sample which includes an aluminum foil, an aluminum foil was etched away by using a hydrochloric solution. By the above processes, a cured resin sheet was obtained. The insulation breakdown voltage of the obtained cured resin sheet under alternating current was measured by using YST-243-100RHO manufactured by YAMAYO MEASURING TOOLS CO., LTD. in a similar manner as mentioned above. Measurement was performed under the conditions: pressure increase speed 1 kV/sec., measurement temperature: 23° C.±2° C., and under the air.

(Shear Adhesive Strength of B Stage Resin Sheet Having PET Films on Both Surfaces of Support)

PET films were peeled from both surfaces of a B stage sheet, and metal plates were bonded on the both surfaces respectively to measure the tensile shear adhesive strength of the B stage sheet according to JIS K6850. Specifically, two copper plates of 100 mm×25 mm×3 mm width were overlapped on the B stage sheet having 12.5 mm×25 mm×0.2 mm alternately and bonded with each other. The thus obtained sheet was stretched by SHIMADZU CORPORATION AGC-100 at a testing speed of 1 mm/min, and a measurement temperature of 23° C. to perform measurement. Bonding was performed by using a vacuum heat pressing (heat plate temperature 165° C., degree of vacuum ≤1 kPa, pressure 4 MPa, treatment time 3 min.).

(Shear Adhesive Strength of Cured Resin Sheet Having PET Films on Both Surfaces of Support)

PET films were peeled from both surfaces of a B stage sheet, and metal plates were bonded on the both surfaces respectively to measure the tensile shear adhesive strength of the B stage sheet according to JIS K6850. Specifically, two copper plates of 100 mm×25 mm×3 mm width were overlapped on the B stage sheet having 12.5 mm×25 mm×0.2 mm alternately and bonded with each other and subjected to a curing treatment. The thus obtained sheet was stretched by SHIMADZU CORPORATION AGC-100 at a testing speed of 1 mm/min, and a measurement temperature of 23° C. to perform measurement.

Bonding and cure treatment was performed as follows: a vacuum heat pressing (heat plate temperature 165° C., degree of vacuum ≤1 kPa, pressure 4 MPa, treatment time 3 min.) was performed and the copper plate was bonded, followed by performing a cure treatment by step cure: 140° C. for two hours, 165° C. for two hours, and 190° C. for two hours in a box-type oven.

(Shear Adhesive Strength of B Stage Sheet Having Aluminum Foil or Copper Foil on One Surface of Support and PET Film on the Other Surface of Support)

A PET film is peeled from one surface of the B stage sheet and a metal plate was bonded thereon. On the aluminum foil side or copper foil side, a similar metal plate was bonded by using an epoxy resin adhesive, and measurement of the tensile shear adhesive strength of the B stage sheet was performed in accordance with JIS K6850. Specifically, one copper plate of 100 mm×25 mm×3 mm width and an aluminum foil or a copper foil were overlapped on the B stage sheet having 12.5 mm×25 mm×0.2 mm alternately and bonded with each other and subjected to a curing treatment. The thus obtained sheet was stretched by SHIMADZU CORPORATION AGC-100 at a testing speed of 1 mm/min, and a measurement temperature of 23° C. to perform measurement. Bonding to the surface of copper plate where a PET film was peeled was performed by vacuum heat pressing (heat plate temperature 165° C., degree of vacuum ≤1 kPa, pressure 4 MPa, treatment time 3 min.). Bonding of an aluminum foil to the copper plate was performed by using an epoxy resin adhesive (manufactured by Huntsman Advanced Materials GmbH, standard) while heating at 50° C.

(Shear Adhesive Strength of Cured Resin Sheet Having Aluminum Foil or Copper Foil on One Surface of Support and PET Film on the Other Surface of Support)

A PET film is peeled from one surface of the cured resin sheet and a metal plate was bonded thereon. On the aluminum foil side, a similar metal plate was bonded by using an epoxy resin adhesive, and measurement of the tensile shear adhesive strength of the C stage sheet was performed in accordance with JIS K6850. Specifically, one copper plate of 100 mm×25 mm×3 mm width and an aluminum foil were overlapped on the B stage sheet having 12.5 mm×25 mm×0.2 mm alternately and bonded with each other and subjected to a curing treatment. The thus obtained sheet was stretched by SHIMADZU CORPORATION AGC-100 at a testing speed of 1 mm/min, and a measurement temperature of 23° C. to perform measurement. Bonding to the surface of copper plate where a PET film was peeled and curing were performed by bonding using vacuum heat pressing (heat plate temperature 165° C., degree of vacuum ≤1 kPa, pressure 4 MPa, treatment time 3 min.), followed by performing a cure treatment by step cure: 140° C. for two hours, 165° C. for two hours, and 190° C. for two hours in a box-type oven. Bonding of an aluminum foil or a copper foil to the copper plate was performed, after cure treatment, by using an epoxy resin adhesive (manufactured by Huntsman Advanced Materials GmbH, standard) while heating at 50° C.

(Arithmetic Mean Roughness Measurement on the Surface of B Stage Sheet)

The sheet surface roughness of a B stage sheet was performed by using a Surface Roughness Measuring Instrument manufactured by Kosaka Laboratory Ltd. under a measurement condition of 1 mm/s. Evaluation was performed using an arithmetic mean roughness as the surface roughness.

(Arithmetic Mean Roughness Measurement of the Surface of Cured Resin Sheet)

From a cured resin sheet laminate in a C stage state obtained in the above, a copper foil was etched away by using a sodium persulfate solution. Further, for a sample which includes an aluminum foil, an aluminum foil was etched away by using a hydrochloric solution. By the above processes, a cured resin sheet, which is a sheet considered in isolation, was obtained. The sheet surface roughness of the cured resin sheet (C stage sheet) was measured by using Surface Roughness Measuring Instrument manufactured by Kosaka Laboratory Ltd. under a measurement condition of 1 mm/s. The surface roughness was evaluated by employing the arithmetic mean roughness in a similar manner as in the evaluation of a B stage sheet.

(Average Thickness of A Stage Sheet)

The average thickness of an A stage sheet was measured in the following manner. For each of the two A stage sheets produced in each Example, an A stage sheet with a support was cut out into a 100 mm square block, and the thicknesses at nine points on the block were measured using Micrometer IP65 manufactured by Mitutoyo Corporation. By subtracting the thickness of a PET film or an aluminum foil which is a support as being not changed, the thickness of each resin layer was determined, and the arithmetic mean value thereof was determined as an average thickness of each resin sheet. One of the two A stage sheets was referred to as a-side resin sheet; and the other "b-side resin sheet".

(Average Thickness of B Stage Sheet)

The sheet thickness of a B stage sheet was measured in the following manner. A B stage sheet with a support was cut out into a 100 mm square block, and the thicknesses at nine points on the block were measured using Micrometer IP65 manufactured by Mitutoyo Corporation. By subtracting the thickness of a PET film or an aluminum foil which is a support as being not changed, the thickness of each resin layer was determined, and the arithmetic mean value thereof was determined as an average thickness of each B stage sheet.

(Average Thickness of Cured Resin Sheet)

From a cured resin sheet laminate in a C stage state obtained in the above, a copper foil was etched away by using a sodium persulfate solution. Further, for a sample which includes an aluminum foil, an aluminum foil was etched away by using a hydrochloric solution. By the above processes, a cured resin sheet was obtained. The cured resin sheet was cut into a 100 mm square block, and the thicknesses at nine points on the block were measured using Micrometer IP65 manufactured by Mitutoyo Corporation. The arithmetic mean value thereof was determined as an average thickness of each cured resin sheet.

(Evaluation of Moisture Resistance and Insulation Properties)

From a cured resin sheet laminate in a C stage state obtained in the above, a copper foil on one side was left as it was, and four 20Φ circular patterns were formed on the copper foil on the opposite surface apart from one another by 20 mm, to manufacture a substrate for evaluation. For one Example or Comparative Example, two substrates for evaluation were used, and for eight circular patterns in total, the moisture resistance and insulation properties were evaluated in the followin manner.

To each circular pattern, a 750V direct-current voltage was applied under an environmental condition of 85° C. 85% for 1000 hours to judge whether there was an electrical breakdown or not. As the evaluation results, the ratio of the number of circular patterns in which an electrical breakdown did not occur with respect to the total number (8) of the circular patterns which were used for the test was represented in fraction.

TABLE 2

| | | | Example 1 | Example 2 | Example 3 | Example 4 | Example 5 | Example 6 | Example 7 |
|---|---|---|---|---|---|---|---|---|---|
| Resin Composition | Filler (part) | AA-04 | 12.62 | 12.62 | 12.62 | 12.62 | 12.62 | 12.62 | 12.62 |
| | | AA-3 | 30.29 | 30.29 | 30.29 | 30.29 | 30.29 | 30.29 | 30.29 |
| | | AA-18 | — | — | — | — | — | — | — |
| | | HP-40 | 46.04 | 34.53 | 23.02 | 46.04 | 46.04 | 46.04 | 46.04 |
| | | FS-3 | — | 11.51 | 23.02 | — | — | — | — |
| | Epoxy Resin Monomer (part) | MOPOC | 11.73 | 11.73 | 11.73 | — | — | — | — |
| | | PNAP | — | — | — | — | 5.6 | 5.6 | 5.6 |
| | | Bis-A/D | — | — | — | 11.15 | 5.6 | 5.6 | 5.6 |
| | Curing Agent (part) | CRN4 | 7.23 | 7.23 | 7.23 | 8.38 | 8.27 | 8.27 | 8.27 |
| | Coupling Agent | KBM-573 | 0.09 | 0.09 | 0.09 | 0.09 | 0.09 | 0.09 | 0.09 |
| | Curing Catalyst | TPP | 0.13 | 0.13 | 0.13 | 0.13 | 0.13 | 0.13 | 0.13 |
| | Organic Solvent | CHN | 46.02 | 46.02 | 46.02 | 37.14 | 37.2 | 37.2 | 37.2 |
| A Stage Resin Sheet | a-side Average Thickness (μm) | | 151 | 153 | 162 | 141 | 142 | 141 | 115 |
| | a-side Support | | PET | PET | PET | PET | PET | Aluminum | Aluminum |
| | b-side Average Thickness (μm) | | 150 | 153 | 161 | 142 | 142 | 142 | 173 |
| | b-side Support | | PET | PET | PET | PET | PET | PET | PET |
| B Stage Resin Sheet | Average Thickness (μm) | | 198 | 201 | 199 | 198 | 200 | 192 | 193 |
| | Arithmetic Mean Roughness (μm) | | 1.8 | 1.9 | 2.3 | 1.7 | 2.2 | 1.8 | 2.0 |
| | Shear Strength (MPa) | | 5.7 | 4.8 | 4.2 | 4.4 | 5.3 | 5.1 | 5.5 |
| | Insulation Breakdown Voltage (kVrms) | | 3.4 | 3.2 | 2.8 | 3.7 | 3.8 | 4.2 | 4.8 |
| Cured C Stage Resin Sheet | Average Thickness (μm) | | 192 | 195 | 191 | 194 | 193 | 185 | 188 |
| | Arithmetic Mean Roughness (μm) | | 1.8 | 1.6 | 2.1 | 1.2 | 1.7 | 1.5 | 1.4 |
| | Thermal Conductivity (W/mK) | | 15 | 14 | 13 | 9 | 11 | 11 | 11 |
| | Shear Strength (MPa) | | 7.7 | 6.8 | 6.2 | 5.9 | 5.8 | 5.6 | 6.1 |
| | Insulation Breakdown Voltage (kVrms) | | 8.6 | 8.3 | 7.9 | 9.5 | 8.9 | 7.6 | 8.6 |
| | Moisture Resistance and Insulation Properties | | 8/8 | 8/8 | 8/8 | 8/8 | 8/8 | 8/8 | 8/8 |

TABLE 3

| | | | Example 8 | Example 9 | Example 10 | Example 11 | Example 12 | Example 13 |
|---|---|---|---|---|---|---|---|---|
| Resin Composition | Filler (part) | AA-04 | 12.62 | 12.62 | 12.62 | 12.62 | 12.62 | 12.62 |
| | | AA-3 | 30.29 | 30.29 | 30.29 | 30.29 | 12.62 | 12.62 |
| | | AA-18 | — | — | — | — | — | — |
| | | HP-40 | 46.04 | 46.04 | 46.04 | 46.04 | 55.81 | 55.8 |
| | | FS-3 | — | — | — | — | — | — |
| | Epoxy Resin Monomer (part) | MOPOC | — | — | — | — | — | — |
| | | PNAP | 5.6 | 5.6 | 5.6 | 5.6 | 9.17 | 9.17 |
| | | Bis-A/D | 5.6 | 5.6 | 5.6 | 5.6 | 9.17 | 9.17 |
| | Curing Agent (part) | CRN1 | 8.27 | — | — | — | — | — |
| | | CRN2 | — | 8.27 | — | — | — | — |
| | | CRN3 | — | — | 8.27 | — | — | — |
| | | CRN4 | — | — | — | — | 13.5 | 13.5 |
| | | CRN5 | — | — | — | 8.27 | — | — |
| | Coupling Agent | KBM-573 | 0.09 | 0.09 | 0.09 | 0.09 | 0.08 | 0.08 |
| | Curing Catalyst | TPP | 0.13 | 0.13 | 0.13 | 0.13 | 0.2 | 0.2 |
| | Organic Solvent | CHN | 37.2 | 37.2 | 37.2 | 37.2 | 38.8 | 38.8 |
| A stage resin sheet | a-side Average Thickness (μm) | | 138 | 140 | 138 | 141 | 139 | 142 |
| | a-side Support | | PET | PET | PET | PET | PET | copper foil |
| | b-side Average Thickness (μm) | | 140 | 139 | 141 | 142 | 137 | 137 |
| | b-side Support | | PET | PET | PET | PET | PET | PET |
| B Stage Resin Sheet | Average Thickness (μm) | | 207 | 206 | 202 | 205 | 209 | 211 |
| | Arithmetic Mean Roughness (μm) | | 2.2 | 2.4 | 2.1 | 2.3 | 1.8 | 2.1 |
| | Shear Strength (MPa) | | 5.3 | 4.8 | 4.7 | 3.9 | 5.6 | 7.6 |
| | Insulation Breakdown Voltage (kVrms) | | 4.1 | 3.6 | 3.9 | 4.2 | 5.3 | 7.4 |
| Cured C Stage Resin Sheet | Average Thickness (μm) | | 185 | 187 | 191 | 195 | 196 | 202 |
| | Arithmetic Mean Roughness (μm) | | 1.7 | 1.4 | 1.5 | 1.3 | 1.6 | 1.7 |
| | Thermal Conductivity (W/mK) | | 11 | 11 | 11 | 11 | 11 | 11 |
| | Shear Strength (MPa) | | 8.8 | 8.4 | 8.0 | 7.3 | 9.8 | 9.5 |
| | Insulation Breakdown Voltage (kVrms) | | 7.8 | 8.3 | 8.6 | 8.5 | 9.8 | 10.2 |
| | Moisture Resistance and Insulation Properties | | 8/8 | 8/8 | 8/8 | 8/8 | 8/8 | 8/8 |

TABLE 4

| | | | Example 14 | Example 15 | Example 16 | Example 17 | Example 18 | Example 19 | Example 20 |
|---|---|---|---|---|---|---|---|---|---|
| Resin Composition | Filler (part) | AA-04 | 12.62 | 12.62 | 12.62 | 12.62 | 12.62 | 12.62 | 12.62 |
| | | AA-3 | 12.62 | 12.62 | 12.62 | 12.62 | 12.62 | 12.62 | 12.62 |
| | | AA-18 | — | — | — | — | — | — | — |
| | | HP-40 | 55.81 | 55.81 | 55.81 | 55.81 | 55.81 | 55.81 | 55.81 |
| | | FS-3 | — | — | — | — | — | — | — |
| | Epoxy Resin Monomer (part) | MOPOC | — | — | — | — | — | — | — |
| | | PNAP | 9.17 | 6.62 | 6.62 | 6.62 | 4.34 | 4.34 | 4.34 |
| | | Bis-A/D | 9.17 | 6.62 | 6.62 | 6.62 | 4.34 | 4.34 | 4.34 |
| | Curing Agent (part) | CRN1 | — | — | — | — | — | — | — |
| | | CRN2 | — | — | — | — | — | — | — |
| | | CRN3 | — | — | — | — | — | — | — |
| | | CRN4 | 13.5 | 9.78 | 9.78 | 9.78 | 6.41 | 6.41 | 6.41 |
| | | CRN5 | — | — | — | — | — | — | — |
| | Coupling Agent | KBM-573 | 0.08 | 0.08 | 0.08 | 0.08 | 0.08 | 0.08 | 0.08 |
| | Curing Catalyst | TPP | 0.2 | 0.15 | 0.15 | 0.15 | 0.10 | 0.10 | 0.10 |
| | Organic Solvent | CHN | 38.8 | 34.8 | 34.8 | 34.8 | 32.4 | 32.4 | 32.4 |
| A Stage Resin Sheet | a-side Average Thickness (μm) | | 139 | 141 | 145 | 138 | 142 | 146 | 145 |
| | a-side Support | | Aluminum | PET | copper foil | Aluminum | PET | copper foil | Aluminum |
| | b-side Average Thickness (μm) | | 137 | 138 | 138 | 138 | 135 | 136 | 138 |
| | b-side Support | | PET | PET | PET | PET | PET | PET | PET |
| B Stage Resin Sheet | Average Thickness (μm) | | 211 | 209 | 205 | 208 | 206 | 208 | 207 |
| | Arithmetic Mean Roughness (μm) | | 1.9 | 2.1 | 2.2 | 2.5 | 2.1 | 1.9 | 2.2 |
| | Shear Strength (MPa) | | 4.6 | 5.3 | 5.9 | 6.5 | 4.2 | 4.7 | 5.7 |
| | Insulation Breakdown Voltage (kVrms) | | 6.2 | 5.4 | 5.9 | 5.7 | 5.9 | 3.3 | 6.2 |
| Cured C Stage Resin Sheet | Average Thickness (μm) | | 206 | 205 | 199 | 203 | 200 | 198 | 203 |
| | Arithmetic Mean Roughness (μm) | | 1.1 | 1.8 | 1.9 | 1.3 | 1.9 | 1.6 | 1.2 |
| | Thermal Conductivity (W/mK) | | 11 | 15 | 13 | 14 | 17 | 18 | 17 |
| | Shear Strength (MPa) | | 8.6 | 10.2 | 8.7 | 10.3 | 7.6 | 8.6 | 8.2 |
| | Insulation Breakdown Voltage (kVrms) | | 9.6 | 9.6 | 9.9 | 10.2 | 11.2 | 11.8 | 10.6 |
| | Moisture Resistance and Insulation Properties | | 8/8 | 8/8 | 8/8 | 8/8 | 8/8 | 8/8 | 8/8 |

TABLE 5

|  |  |  | Comparative Example 1 | Comparative Example 2 | Comparative Example 3 | Comparative Example 4 |
|---|---|---|---|---|---|---|
| Resin Composition | Filler (part) | AA-04 | 8.33 | 12.62 | 12.62 | 12.62 |
|  |  | AA-3 | 19.99 | 30.29 | 30.29 | 30.29 |
|  |  | AA-18 | 54.97 | — | — | — |
|  |  | HP-40 | — | 46.04 | 46.04 | 46.04 |
|  |  | FS-3 | — | — | — | — |
|  | Epoxy Resin Monomer (part) | MOPOC | 19.39 | — | — | — |
|  |  | PHAP | — | — | — | — |
|  |  | Bis-A/D | — | 11.09 | 10.54 | 13.68 |
|  | Curing Agent (part) | CRN4 | 11.96 | — | — | — |
|  |  | PN | — | 7.83 | — | — |
|  |  | CPN | — | — | 8.37 | — |
|  |  | TPM | — | — | — | 5.23 |
|  | Coupling Agent | KBM-573 | 0.13 | 0.09 | 0.09 | 0.09 |
|  | Curing Catalyst | TPP | 0.20 | 0.13 | 0.13 | 0.13 |
|  | Organic Solvent | CHN | 9.29 | 46.02 | 37.14 | 37.2 |
|  |  | MEK | 44.77 | — | — | — |
| A stage Resin Sheet | a-side Average Thickness (μm) |  | 151 | 153 | 141 | 142 |
|  | a-side Support |  | PET | PET | PET | PET |
|  | b-side Average thickness (μm) |  | 150 | 153 | 142 | 142 |
|  | b-side Support |  | PET | PET | PET | PET |
| B stage Resin Sheet | Average Thickness (μm) |  | 198 | 201 | 198 | 200 |
|  | Arithmetic Mean Roughness (μm) |  | 5.4 | 1.9 | 1.7 | 2.2 |
|  | Shear Strength (MPa) |  | 2.1 | 0.8 | 0.9 | 0.5 |
|  | Insulation Breakdown Voltage (kVrms) |  | 1.9 | 2.5 | 2.8 | 2.9 |
| Cured C Stage Resin Sheet | Average Thickness (μm) |  | 192 | 195 | 194 | 193 |
|  | Arithmetic Mean Roughness (μm) |  | 1.7 | 1.5 | 1.7 | 1.3 |
|  | Thermal Conductivity (W/mK) |  | 14 | 10 | 8 | 7 |
|  | Shear Strength (MPa) |  | 2.1 | 1.7 | 1.5 | 1.8 |
|  | Insulation Breakdown Voltage (kVrms) |  | 3.3 | 6.8 | 7.6 | 7.3 |
|  | Moisture Resistance and Insulation Properties |  | 5/8 | 2/8 | 3/8 | 7/8 |

With consideration of Tables 2 to 5, it is conceivable that B stage state resin sheet containing a filler having specific constitution and a novolac resin containing a compound having a structural unit represented by the general Formula (I), and a cured resin sheet in a C stage state which is a cured material thereof each has an excellent thermal conductivity, as well as excellent adhesive strength and breakdown voltage.

From the above, it is found that the cured resin sheet formed by using a resin composition of the present invention has a thermal treatment thermal conductivity, adhesive strength and insulation properties all of which are excellent.

The disclosure of Japanese Patent Application No. 2011-071251 is incorporated by reference herein in their entireties. All the literature, patent applications, and technical standards cited herein are also herein incorporated to the same extent as provided for specifically and severally with respect to an individual literature, patent application, and technical standard to the effect that the same should be so incorporated by reference.

The invention claimed is:

1. A resin composition comprising an epoxy resin monomer, a novolac resin containing a compound having a structural unit represented by general Formula (I), and a filler, in which a particle size distribution of the filler, measured using laser diffractometry, has peaks in the respective ranges of from 0.01 μm to less than 1 μm, from 1 μm to less than 10 μm, and from 10 μm to 100 μm, and the filler having particle sizes of from 10 μm to 100 μm contains boron nitride particles;

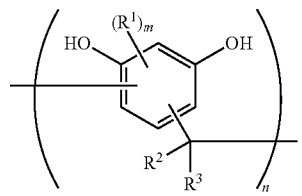

wherein in the general Formula (I), $R^1$ represents an alkyl group, an aryl group, or an aralkyl group; each of $R^2$ and $R^3$ independently represents a hydrogen atom, an alkyl group, aryl group, or an aralkyl group; m represents a number from 0 to 2; and n represents a number from 1 to 7.

2. The resin composition according to claim 1, wherein the novolac resin further contains a phenol compound constituting a novolac resin, and a content ratio of the phenol compound is from 5% by mass to 50% by mass.

3. A resin sheet formed by molding the resin composition according to claim 1 into a sheet shape having an average thickness of from 80 μm to 250 μm.

4. The resin sheet according to claim 3, wherein an arithmetic mean roughness of the surface of the resin sheet thereof is from 1.0 μm to 2.5 μm.

5. The resin sheet according to claim 3, which is a laminate of a first resin layer and a second resin layer formed of the resin composition.

6. The resin sheet according to claim 5, further having a metal foil on one surface of the laminate, and further having a polyethylene terephthalate film on the other surface thereof.

7. A cured resin sheet which is a thermally treated material of the resin sheet according to claim 3.

8. A resin sheet laminate including the resin sheet according to claim 3, and a metal plate or a heat-dissipating plate disposed on at least one surface of the resin sheet.

9. A cured resin sheet laminate which is a thermally treated material of the resin sheet laminate according to claim 8.

10. A semiconductor device comprising a semiconductor element, and the cured resin sheet according to claim 7 which is disposed on the semiconductor element.

11. An LED device in which an LED element, the cured resin sheet according to claim 7 and a substrate are laminated in this order.

12. A resin composition comprising
an epoxy resin monomer,
a novolac resin containing a compound having a structural unit represented by general Formula (I),
a first filler having a volume-average particle size of from 0.01 μm to less than 1 μm,
a second filler having a volume-average particle size of from 1 μm to less than 10 μm, and
a third filler having a volume-average particle size of from 10 μm to 100 μm and containing a boron nitride particle;

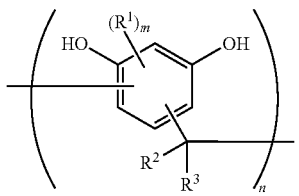

(I)

in which in the general Formula (I), $R^1$ represents an alkyl group, an aryl group, or an aralkyl group; each of $R^2$ and $R^3$ independently represents a hydrogen atom, an alkyl group, an aryl group, or an aralkyl group; m represents a real number from 0 to 2; and n represents a real number from 1 to 7.

13. The resin composition according to claim 12, wherein the first filler contains an aluminum oxide particle.

14. The resin composition according to claim 12, wherein
a content of the first filler is from 1% by volume to 15% by volume,
a content of the second filler is from 10% by volume to 40% by volume, and
a content of the third filler is from 45% by volume to 80% by volume, based on a total volume of the first filler, the second filler and the third filler.

15. The resin composition according to claim 12, wherein the novolac resin further contains a phenol compound constituting a novolac resin, and
a content ratio of the phenol compound is from 5% by mass to 50% by mass.

16. A resin sheet formed by molding the resin composition according to claim 13 into a sheet shape having an average thickness of from 80 μm to 250 μm.

17. The resin sheet according to claim 16, wherein an arithmetic mean roughness of the surface thereof is from 1.0 μm to 2.5 μm.

18. The resin sheet according to claim 17, which is a laminate of a first resin layer and a second resin layer formed of the resin composition.

19. The resin sheet according to claim 18, further having a metal foil on one surface of the laminate, and
further having a polyethylene terephthalate film on the other surface thereof.

20. A cured resin sheet which is a thermally treated material of the resin sheet according to claim 16.

21. A resin sheet laminate including the resin sheet according to claim 16, and a metal plate or a heat-dissipating plate disposed on at least one surface of the resin sheet.

22. A cured resin sheet laminate which is a thermally treated material of the resin sheet laminate according to claim 21.

23. A semiconductor device comprising a semiconductor element, and the cured resin sheet according to claim 20 which is disposed on the semiconductor element.

24. An LED device in which an LED element, the cured resin sheet according to claim 20 and a substrate are laminated in this order.

* * * * *